United States Patent
Mimura et al.

(10) Patent No.: US 11,453,942 B2
(45) Date of Patent: Sep. 27, 2022

(54) SUBSTRATE PROCESSING APPARATUS AND METHOD OF MANUFACTURING SEMICONDUCTOR DEVICE

(71) Applicant: Kokusai Electric Corporation, Tokyo (JP)

(72) Inventors: Hidetoshi Mimura, Toyama (JP); Takafumi Sasaki, Toyama (JP); Hidenari Yoshida, Toyama (JP); Yusaku Okajima, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/518,479

(22) Filed: Jul. 22, 2019

(65) Prior Publication Data
US 2019/0345605 A1    Nov. 14, 2019

Related U.S. Application Data

(63) Continuation of application No. PCT/JP2017/034051, filed on Sep. 21, 2017.

(30) Foreign Application Priority Data

Feb. 23, 2017    (JP) .............................. JP2017-032065

(51) Int. Cl.
*C23C 16/40*    (2006.01)
*C23C 16/44*    (2006.01)
(Continued)

(52) U.S. Cl.
CPC ........ *C23C 16/4412* (2013.01); *C23C 16/345* (2013.01); *C23C 16/52* (2013.01); *H01L 21/0217* (2013.01)

(58) Field of Classification Search
CPC ... C23C 16/4412; C23C 16/345; C23C 16/52; C23C 16/45523; C23C 16/45574;
(Continued)

(56) References Cited

U.S. PATENT DOCUMENTS 5,968,593 A * 10/1999 Sakamoto ......... H01L 21/67109
118/715
10,453,735 B2 * 10/2019 Okajima ............... C23C 16/458
(Continued)

FOREIGN PATENT DOCUMENTS

JP    2010-226092 A    10/2010
JP    2012-67328 A    4/2012
(Continued)

*Primary Examiner* — Rudy Zervigon
(74) *Attorney, Agent, or Firm* — Edell, Shapiro & Finnan, LLC

(57) ABSTRACT

Described herein is a technique capable of improving a film thickness uniformity on a surface of a wafer whereon a film is formed. According to one aspect of the technique of the present disclosure, there is provided a substrate processing apparatus including: a process chamber in which a substrate is processed; a process gas nozzle configured to supply a process gas into the process chamber; an inert gas nozzle configured to supply an inert gas into the process chamber while a concentration of the process gas at the center of the substrate is higher than a concentration required for processing the substrate; and an exhaust pipe configured to exhaust an inner atmosphere of the process chamber; wherein the process gas nozzle and the inert gas nozzle are disposed beside the edge of substrate with a predetermined distance therebetween corresponding to an angle of circumference of 90 to 180 degrees.

18 Claims, 10 Drawing Sheets

(51) Int. Cl.
*C23C 16/34* (2006.01)
*C23C 16/52* (2006.01)
*H01L 21/02* (2006.01)

(58) Field of Classification Search
CPC .......... C23C 16/45578; C23C 16/4584; C23C 16/455; H01L 21/0217; H01L 21/02211; H01L 21/0228; H01L 21/0262; H01L 21/67017
USPC .............. 118/715, 719; 156/345.31, 345.32, 156/345.33
See application file for complete search history.

(56) References Cited

U.S. PATENT DOCUMENTS

| | | | | |
|---|---|---|---|---|
| 2001/0006043 | A1* | 7/2001 | Shealy | C30B 25/14 118/724 |
| 2001/0050054 | A1* | 12/2001 | Kwag | C30B 25/14 118/715 |
| 2002/0000432 | A1* | 1/2002 | Shirakawa | H01L 21/67109 219/390 |
| 2002/0048860 | A1* | 4/2002 | Moriyama | H01L 21/67109 438/149 |
| 2002/0124800 | A1 | 9/2002 | Moriyama | |
| 2002/0146511 | A1* | 10/2002 | Chiang | C23C 16/45544 427/248.1 |
| 2002/0195054 | A1* | 12/2002 | Harafuji | C23C 16/52 118/715 |
| 2003/0186517 | A1* | 10/2003 | Takagi | H01L 21/67109 438/478 |
| 2004/0025786 | A1* | 2/2004 | Kontani | C23C 16/45578 118/715 |
| 2004/0216665 | A1* | 11/2004 | Soininen | C23C 16/4412 118/715 |
| 2005/0039686 | A1* | 2/2005 | Zheng | C23C 16/4583 118/728 |
| 2005/0045102 | A1* | 3/2005 | Zheng | C23C 16/45578 118/722 |
| 2005/0098108 | A1* | 5/2005 | Sandhu | C23C 16/045 118/715 |
| 2006/0124058 | A1* | 6/2006 | Sakai | C23C 16/4405 118/715 |
| 2006/0150905 | A1* | 7/2006 | Sakai | C23C 16/455 118/715 |
| 2006/0196418 | A1* | 9/2006 | Lindfors | C23C 16/45578 118/715 |
| 2006/0275546 | A1* | 12/2006 | Arena | C23C 16/452 427/248.1 |
| 2007/0137794 | A1* | 6/2007 | Qiu | C23C 16/46 156/345.33 |
| 2007/0157882 | A1* | 7/2007 | Ozaki | H01L 21/0223 118/715 |
| 2008/0099434 | A1* | 5/2008 | Chandrachood | H01J 37/32935 216/60 |
| 2008/0102001 | A1* | 5/2008 | Chandrachood | H01J 37/32715 422/129 |
| 2008/0124945 | A1* | 5/2008 | Miya | H01L 21/0228 438/778 |
| 2009/0124083 | A1* | 5/2009 | Nodera | C23C 16/452 438/694 |
| 2009/0163042 | A1* | 6/2009 | Tseng | H01L 21/67098 438/795 |
| 2009/0191717 | A1* | 7/2009 | Kim | C23C 16/45546 438/758 |
| 2009/0197424 | A1 | 8/2009 | Sakai et al. | |
| 2009/0223448 | A1* | 9/2009 | Sakai | C23C 16/45546 118/715 |
| 2009/0255468 | A1* | 10/2009 | Yamamoto | C23C 16/4584 118/723 E |
| 2010/0015811 | A1* | 1/2010 | Sato | H01J 37/32082 438/758 |
| 2010/0035440 | A1* | 2/2010 | Fukuda | C23C 16/45546 438/765 |
| 2010/0068893 | A1* | 3/2010 | Kato | H01L 21/68771 438/758 |
| 2010/0105192 | A1* | 4/2010 | Akae | C23C 16/45512 438/478 |
| 2010/0199914 | A1* | 8/2010 | Iza | C23C 16/45508 118/725 |
| 2010/0218724 | A1* | 9/2010 | Okada | C23C 16/4405 118/724 |
| 2011/0065283 | A1* | 3/2011 | Sato | C23C 16/45557 438/758 |
| 2011/0065286 | A1* | 3/2011 | Sasaki | H01L 21/02233 438/770 |
| 2011/0076857 | A1* | 3/2011 | Akae | H01L 21/31608 438/769 |
| 2011/0174212 | A1* | 7/2011 | Ramachandran | C23C 16/45523 117/98 |
| 2011/0247556 | A1* | 10/2011 | Raring | C23C 16/45519 118/713 |
| 2011/0277681 | A1* | 11/2011 | Arena | C23C 16/34 117/88 |
| 2012/0100722 | A1* | 4/2012 | Asai | C23C 16/4408 438/758 |
| 2012/0108077 | A1* | 5/2012 | Kaga | H01L 21/28562 438/771 |
| 2012/0180727 | A1* | 7/2012 | Hasegawa | C23C 16/45578 118/730 |
| 2012/0240853 | A1* | 9/2012 | Carlson | C23C 16/45578 118/715 |
| 2012/0280369 | A1* | 11/2012 | Saito | C23C 16/45527 257/629 |
| 2012/0329286 | A1* | 12/2012 | Takeda | C23C 16/30 438/781 |
| 2013/0098293 | A1* | 4/2013 | Lee | C23C 16/45578 118/728 |
| 2013/0157474 | A1* | 6/2013 | Yuasa | H01L 21/02255 438/758 |
| 2013/0192524 | A1* | 8/2013 | Wu | C23C 16/54 118/719 |
| 2013/0252439 | A1* | 9/2013 | Hirose | H01L 21/02211 438/778 |
| 2013/0280919 | A1* | 10/2013 | Yuasa | C23C 16/40 438/778 |
| 2013/0280921 | A1* | 10/2013 | Takeda | C23C 16/26 438/781 |
| 2014/0137801 | A1* | 5/2014 | Lau | C30B 25/14 118/728 |
| 2014/0170858 | A1* | 6/2014 | Harada | H01L 21/02274 438/758 |
| 2014/0199056 | A1* | 7/2014 | Chang | H01L 21/67115 392/416 |
| 2014/0357058 | A1* | 12/2014 | Takagi | C23C 16/45534 438/478 |
| 2015/0093911 | A1* | 4/2015 | Nakatani | C23C 16/14 438/761 |
| 2015/0152991 | A1* | 6/2015 | Lin | C23C 16/4584 137/1 |
| 2015/0303054 | A1* | 10/2015 | Hanashima | H01L 21/32051 438/758 |
| 2016/0064190 | A1* | 3/2016 | Noh | H01J 37/32779 156/345.33 |
| 2016/0079056 | A1* | 3/2016 | Harada | C23C 16/36 438/778 |
| 2017/0051408 | A1* | 2/2017 | Takagi | C23C 16/45563 |
| 2017/0298508 | A1* | 10/2017 | Yamakoshi | H01L 21/02211 |
| 2017/0314126 | A1* | 11/2017 | Tjandra | H01L 21/67115 |
| 2018/0171467 | A1* | 6/2018 | Hatta | C23C 16/345 |
| 2018/0204735 | A1* | 7/2018 | Yuasa | H01L 21/2686 |
| 2018/0211840 | A1* | 7/2018 | Yamaguchi | H01L 21/67248 |
| 2019/0096738 | A1* | 3/2019 | Okajima | C23C 16/4401 |

(56) References Cited

U.S. PATENT DOCUMENTS

| | | | |
|---|---|---|---|
| 2019/0345605 A1* | 11/2019 | Mimura | H01L 21/0217 |
| 2020/0219717 A1* | 7/2020 | Sato | H01J 37/32 |
| 2021/0087678 A1* | 3/2021 | Ebata | C23C 16/345 |

FOREIGN PATENT DOCUMENTS

| | | | | |
|---|---|---|---|---|
| JP | 2012067328 A | * | 4/2012 | C23C 16/455 |
| JP | 2014-236129 A | | 12/2014 | |
| JP | 2018101687 A | * | 6/2018 | C23C 16/45548 |
| WO | 2016110956 A1 | | 7/2016 | |
| WO | 2016157401 A1 | | 10/2016 | |
| WO | WO-2016157401 A1 | * | 10/2016 | C23C 16/455 |

* cited by examiner

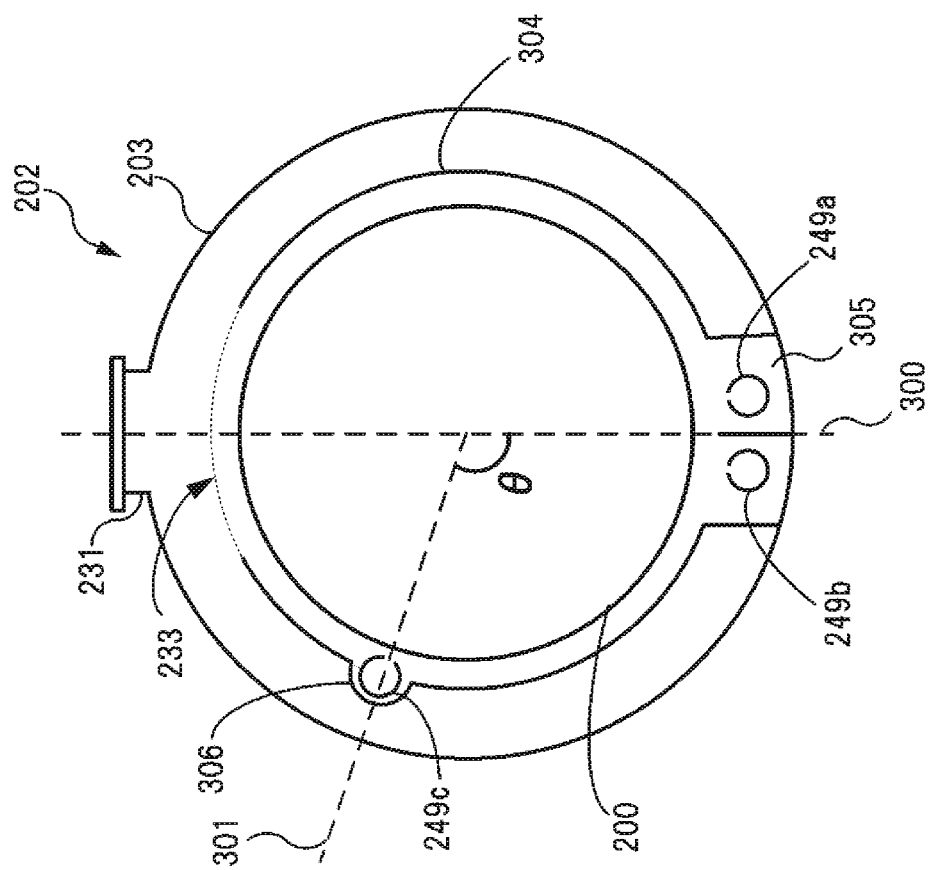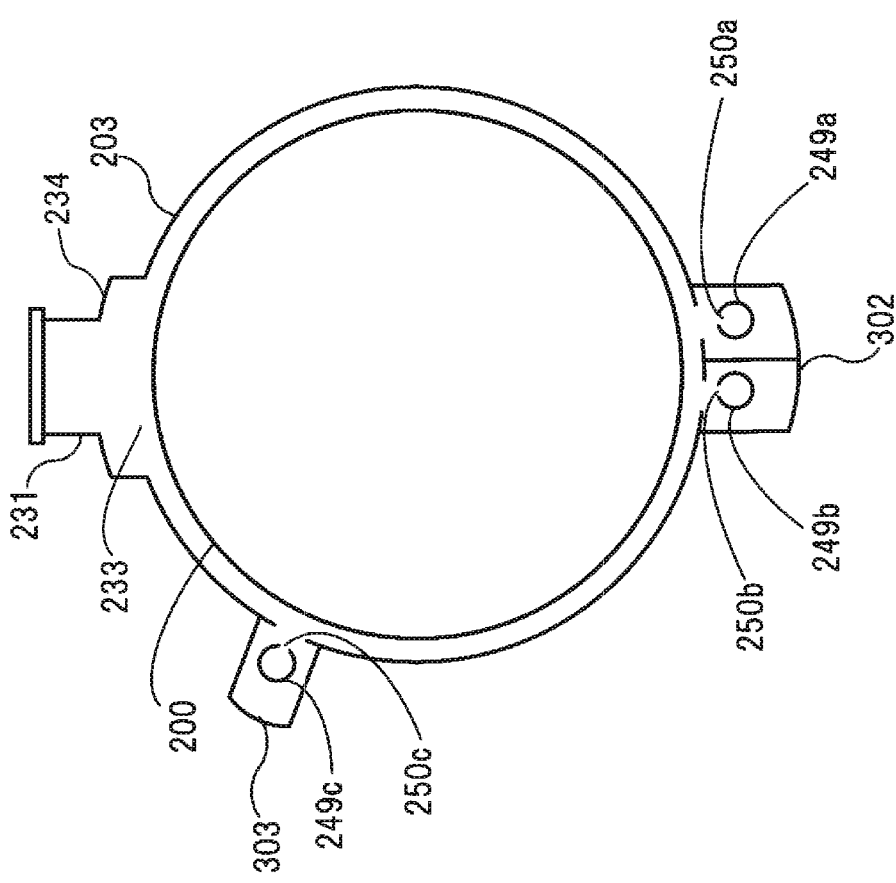

SUBSTRATE PROCESSING APPARATUS AND METHOD OF MANUFACTURING SEMICONDUCTOR DEVICE

CROSS REFERENCE TO RELATED APPLICATIONS

This application is a continuation of International Application No. PCT/JP2017/034051, filed on Sep. 21, 2017, which claims priority under 35 U.S.C. § 119 to Application No. JP 2017-032065 filed on Feb. 23, 2017, the entire contents of which are hereby incorporated by reference.

TECHNICAL FIELD

The present disclosure relates to a substrate processing apparatus and a method of manufacturing a semiconductor device.

BACKGROUND

As one of manufacturing processes of a semiconductor device, a substrate processing of forming a film on a substrate (also referred to as a "wafer") accommodated in a process chamber by supplying a process gas to the substrate may be performed. When the wafer accommodated in the process chamber is a patterned wafer, a film thickness uniformity on a surface of the wafer whereon the film is formed may deteriorate because an amount of the process gas supplied to a center of the wafer is insufficient when the film is formed on the wafer. According to related arts, by adjusting a diffusion rate of the process gas and a deposition rate (also referred to as a "film-forming rate") by reducing an exhaust pressure, it is possible to improve the film thickness uniformity on the surface of the wafer.

However, even when the method described above is used, it may be difficult to adjust the diffusion rate of the process gas and the deposition rate.

SUMMARY

Described herein is a technique capable of improving a film thickness uniformity on a surface of a wafer whereon a film is formed.

According to one aspect of the technique of the present disclosure, there is provided a substrate processing apparatus including: a process chamber in which a substrate is processed; a process gas nozzle configured to supply a process gas into the process chamber; an inert gas nozzle configured to supply an inert gas into the process chamber while a concentration of the process gas at the center of the substrate is higher than a concentration required for processing the substrate; and an exhaust pipe configured to exhaust an inner atmosphere of the process chamber; wherein the process gas nozzle and the inert gas nozzle are disposed beside the edge of substrate with a predetermined distance therebetween corresponding to an angle of circumference of 90 to 180 degrees.

BRIEF DESCRIPTION OF THE DRAWINGS

FIG. 6 schematically illustrates a second modified example of the embodiments described herein.

FIG. 7 schematically illustrates a third modified example of the embodiments described herein.

DETAILED DESCRIPTION

Embodiments

Hereinafter, one or more embodiments (hereinafter, simply referred to as "embodiments") according to the technique of the present disclosure will be described. According to the embodiments, by suppressing a dilution of a process gas by an inert gas and by concentrating a flow of the process gas diffusing on an edge (also referred to as an "end portion") of a wafer to a center of the wafer, it is possible to improve a film thickness uniformity on a surface of the wafer whereon a film is formed. The inert gas nozzle described later may include a plurality of nozzles. For example, the inert gas nozzle includes a first inert gas nozzle and a second inert gas nozzle. As long as a deposition rate is satisfied, an installation angle θ described later of the inert gas nozzle may be changed arbitrarily according to a flow rate of the inert gas ejected through the inert gas nozzle. Hereinafter, the embodiments according to the technique of the present disclosure will be described with reference to FIGS. 1 through 3.

(1) Configuration of Substrate Processing Apparatus

Figure 1:
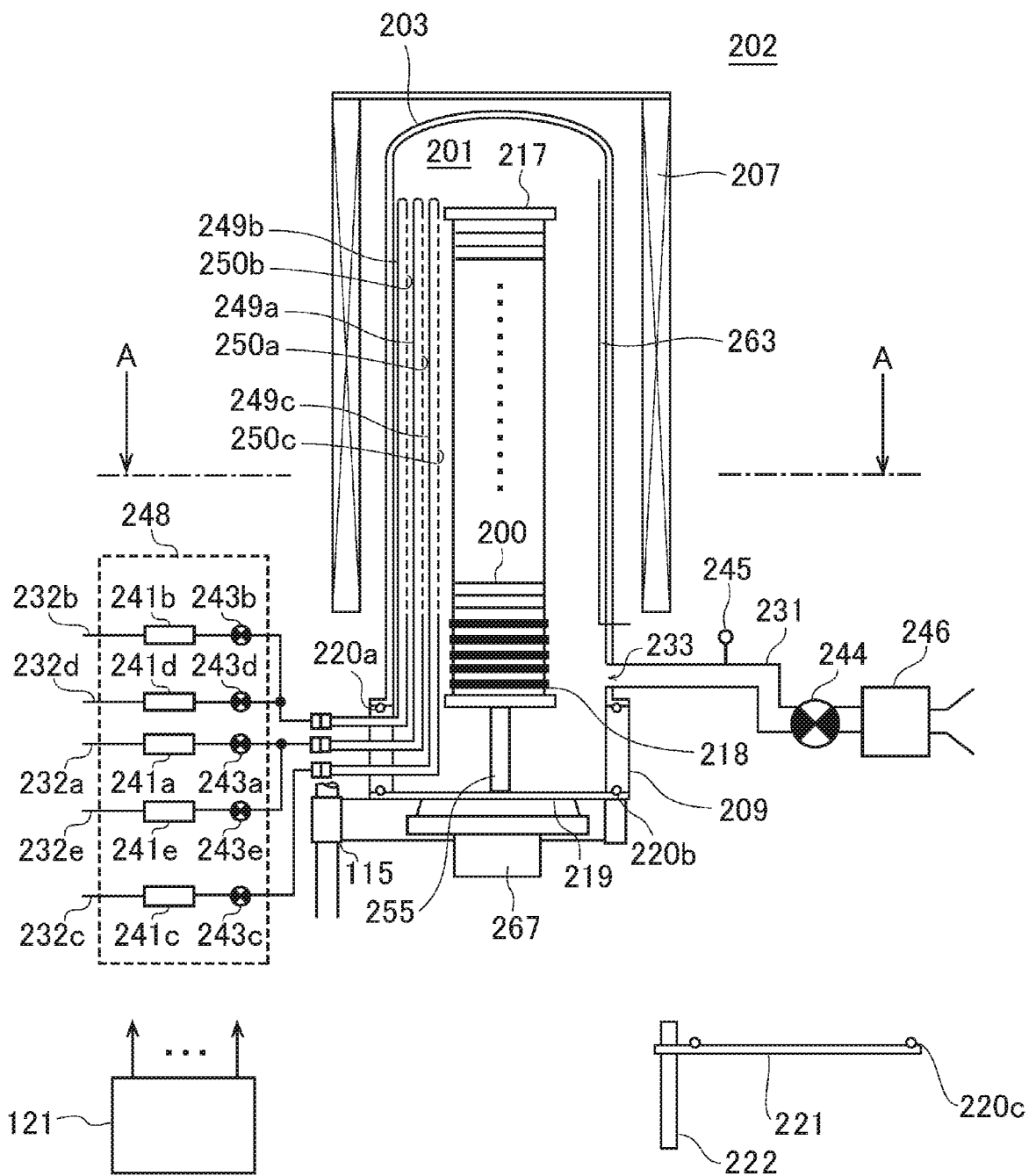
FIG. 1 schematically illustrates a vertical cross-section of a process furnace of a substrate processing apparatus according to one or more embodiments described herein.

A substrate processing apparatus according to the embodiments described herein includes a process furnace 202. As shown in FIG. 1, the process furnace 202 includes a heater 207 serving as a heating apparatus (heating mechanism). The heater 207 is cylindrical, and is vertically installed while being supported by a support plate (not shown). The heater 207 also functions as an activation mechanism (excitation mechanism) capable of activating (exciting) a gas such as the process gas by heat.

A reaction tube 203 is provided at an inner side of the heater 207 so as to be concentric with the heater 207. The reaction tube 203 is made of a heat resistant material such as quartz ($SiO_2$) and silicon carbide (SiC), and is of a cylindrical shape with a closed upper end and an open lower end. A manifold 209 is provided under the reaction tube 203 so as to be concentric with the reaction tube 203. The manifold 209 is made of a metal such as nickel alloy, and is of a short cylindrical shape with open upper and lower ends. The upper end of the manifold 209 is engaged with the lower end of the reaction tube 203 so as to support the reaction tube 203. An O-ring 220a serving as a sealing part is provided between the manifold 209 and the reaction tube 203. The reaction tube 203 is vertically installed in a manner similar to the heater 207. A process vessel (reaction vessel) is constituted mainly by the reaction tube 203 and the manifold 209. A process chamber 201 is provided in a hollow cylindrical portion of the process vessel. The process chamber 201 is configured to accommodate a plurality of wafers including a wafer 200 serving as a substrate.

A nozzle (also referred to as a "first gas nozzle") 249a configured to supply a film-forming gas (process gas), a nozzle (also referred to as a "second gas nozzle") 249b configured to supply another film-forming gas (process gas) and a nozzle (also referred to as a "third gas nozzle") 249c configured to supply only the inert gas are provided in the process chamber 201 through a sidewall of the manifold 209. Gas supply pipes 232a, 232b and 232c are connected to the nozzles 249a, 249b and 249c, respectively.

Mass flow controllers (MFCs) 241a, 241b and 241c serving as flow rate controllers (flow rate control mechanisms) and valves 243a, 243b and 243c serving as opening/closing valves are sequentially installed at the gas supply pipes 232a through 232c, respectively, from the upstream sides to the downstream sides of the gas supply pipes 232a through 232c. Gas supply pipes 232e and 232d configured to supply the inert gas are connected to the gas supply pipes 232a and 232b at the downstream sides of the valves 243a and 243b, respectively. MFCs 241e and 241d and valves 243e and 243d are sequentially installed at the gas supply pipes 232e and 232d, respectively, from the upstream sides to the downstream sides of the gas supply pipes 232e and 232d.

Figure 2:
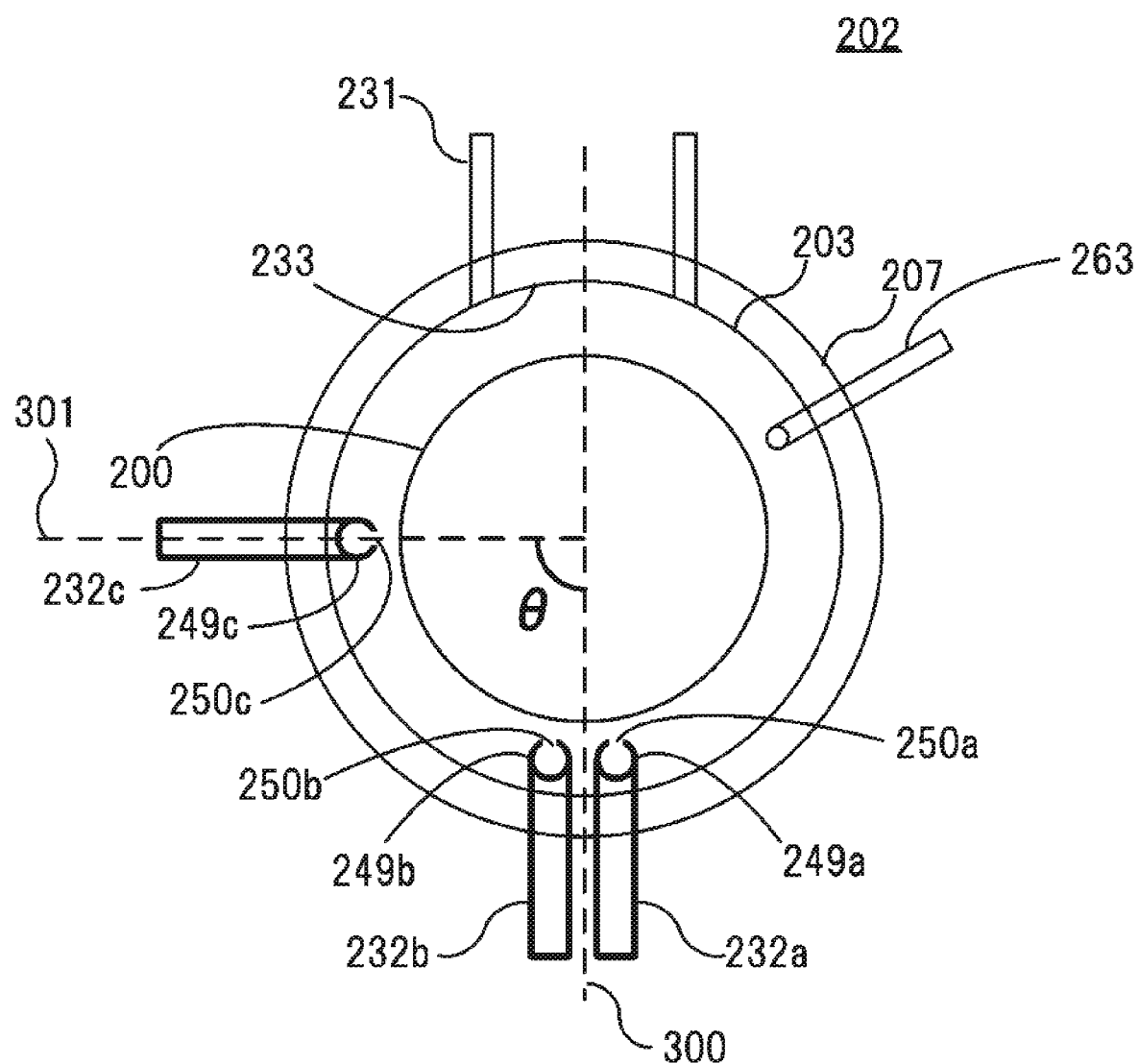
FIG. 2 schematically illustrates a cross-section taken along the line A-A of the process furnace of the substrate processing apparatus according to the embodiments shown in FIG. 1.

As shown in FIG. 2, the nozzles 249a through 249c are provided in an annular space between an inner wall of the reaction tube 203 and the plurality of the wafers including the wafer 200 accommodated in the process chamber 201, and extend from a lower portion of the reaction tube 203 to an upper portion of the reaction tube 203 along a stacking direction of the plurality of the wafers, respectively. That is, the nozzles 249a through 249c are provided in a region that horizontally surrounds a wafer arrangement region where the plurality of the wafers are arranged along the stacking direction of the plurality of the wafers. The first gas nozzle 249a and the second gas nozzle 249b are disposed to face an exhaust port 233 described later while a center of the wafer 200 transferred (loaded) into the process chamber 201 is disposed therebetween. In addition, the first gas nozzle 249a and the second gas nozzle 249b are disposed adjacent to each other.

The nozzle 249c serving as the inert gas nozzle is provided at a location spaced apart from the nozzles 249a and 249b serving as a process gas nozzle by a predetermined distance along a circumferential direction of the wafer 200. In the present specification, the term "process gas nozzle" may indicate only the nozzle 249a, may indicate only the nozzle 249b, or may indicate both of the nozzle 249a and the nozzle 249b. The predetermined distance in the embodiments refers to, for example, such a distance as the nozzle 249c is not adjacent to at least the nozzles 249a and 249b. By providing the nozzle 249c spaced apart from the nozzles 249a and 249b by the predetermined distance, it is possible to suppress a diffusion of the process gas into a space between the plurality of the wafers and an inner surface of the reaction tube 203, and to increase a concentration of the process gas (also referred to as a "space concentration" or density) on the entire surfaces of the plurality of the wafers. When the predetermined distance is an adjacent distance (that is, when the nozzle 249c is adjacent to the nozzles 249a and the nozzle 249b), the concentration of the process gas may be decreased since the process gas and the inert gas are mixed, or an average concentration of the process gas on the entire surfaces of the plurality of the wafers may be decreased since the exhaust may be promoted by diffusing the process gas into the space between the plurality of the wafers and the inner surface of the reaction tube 203. More preferably, the predetermined distance may refer to a distance greater than or equal to a width of each nozzle, at which the nozzle 249c serving as the inert gas nozzle is spaced apart from the nozzles 249a and 249b serving as the process gas nozzle. More preferably, the predetermined distance may refer to a length of an arc portion with an angle θ equal to or greater than 90° and equal to or less than 180°. The angle θ is defined as an angle between a first straight line 300 connecting a center of the process gas nozzle (in the present embodiments, for example, a midpoint between a center of the nozzle 249a and a center of the nozzle 249b) with a center of an exhaust pipe 231 or the wafer 200 and a second straight line 301 connecting the nozzle 249c serving as the inert gas nozzle with the center of the wafer 200. By setting the predetermined distance as described above, it is possible to form a wall or a dam of the inert gas at the space between the wafers and the inner surface of the reaction tube 203 and also near the rims of the wafers. Therefore, it is possible to increase the concentration of the process gas at centers of the plurality of the wafers. More preferably, the predetermined distance is the length of the arc portion whose central angle θ is within a range from 100° to 140°. Such the predetermined distance makes it possible to increase the concentration of the process gas at the centers of the wafers and to increase the concentration of the process gas averaged over the entire surfaces of the wafers. The first straight line 300 could be defined in other ways like a linearly extended line from the center of an exhaust pipe 231 through the center of the wafer 200.

A plurality of gas supply holes 250a, a plurality of gas supply holes 250b and a plurality of gas supply holes 250c are provided at side surfaces of the nozzles 249a through 249c, respectively. The gas supply holes 250a through the gas supply holes 250c are configured to supply the gases such as the process gas and the inert gas toward the centers of the plurality of the wafers including the wafer 200, respectively. For example, the nozzle 249c serving as the inert gas nozzle is provided such that the inert gas is ejected toward the centers of the plurality of the wafers. Preferably, the gas supply holes 250a through the gas supply holes 250c are open toward the centers of the plurality of the wafers, and are provided from the lower portion of the reaction tube 203 to the upper portion of the reaction tube 203, so that the gases flow parallel to the wafers, i.e. perpendicular to the tube axis. Process chambers utilizing such parallel flow are known and described as forced flow or cross flow chamber in contraste to conventional configuration where mass transport are dominated by diffusion.

A source gas (process gas) containing a predetermined element (main element) is supplied into the process chamber 201 through the gas supply pipe 232a provided with the MFC 241a and the valve 243a and the nozzle 249a. For example, a halosilane-based gas containing silicon (Si) as the predetermined element and a halogen element may be supplied into the process chamber 201 as the source gas. The source gas may refer to a source in gaseous state under normal temperature and normal pressure (atmospheric pressure) or a gas obtained by vaporizing a source in liquid state under normal temperature and normal pressure. Halosilane refers to silane containing a halogen group such as chloro group, fluoro group, bromo group and iodo group. That is, the halogen group includes a halogen element such as chlorine (Cl), fluorine (F), bromine (Br) and iodine (I). As the halosilane-based gas, for example, a chlorosilane-based gas containing silicon and chlorine may be used. As the chlorosilane-based gas, for example, hexachlorodisilane ($Si_2Cl_6$, abbreviated as HCDS) gas may be used. The chlorosilane-based gas serves as a silicon source.

A reactant (process gas) having a different chemical structure (molecular structure) than the source gas is supplied into the process chamber 201 through the gas supply pipe 232b provided with the MFC 241b and the valve 243b and the nozzle 249b. For example, a hydrogen nitride-based gas, which is a nitriding gas, is supplied into the process chamber 201 as the reactant. The hydrogen nitride-based gas serves as a nitrogen (N) source. As the hydrogen nitride-based gas, for example, ammonia ($NH_3$) gas may be used.

The inert gas such as nitrogen gas ($N_2$ gas) is supplied into the process chamber 201 via the gas supply pipes 232c through 232e connected to the MFCs 241c through 241e, the valves 243c through 243e, the gas supply pipes 232c through 232a and the nozzles 249a through 249c, respectively. The $N_2$ gas serves as a purge gas or a carrier gas. In addition, the $N_2$ gas also serves as a control gas for controlling a thickness distribution of a film formed on the surface of the wafer 200.

A process gas supply system is constituted mainly by the gas supply pipes 232a and 232b, the MFCs 241a and 241b and the valves 243a and 243b. An inert gas supply system is constituted mainly by the gas supply pipes 232c through 232e, the MFCs 241c through 241e and the valves 243c through 243e.

The exhaust port 233 configured to exhaust an inner atmosphere of the process chamber 201 is provided at the reaction tube 203. As shown in FIG. 2, the exhaust port 233 is disposed at a location facing the nozzles 249a and 249b (the plurality of the gas supply holes 250a and the plurality of the gas supply holes 250b) with the wafer 200 interposed therebetween. The exhaust pipe 231 is connected to the exhaust port 233. The exhaust pipe 231 is provided with a pressure sensor 245 serving as a pressure detector that detects an inner pressure of the process chamber 201. A vacuum pump 246 serving as a vacuum exhausting apparatus is connected to the exhaust pipe 231 through the pressure sensor 245 and an APC (Automatic Pressure Controller) valve 244. The APC valve 244 serves as a pressure controller (pressure adjusting mechanism). With the vacuum pump 246 in operation, the APC valve 244 may be opened or closed to vacuum-exhaust the process chamber 201 or stop the vacuum exhaust. With the vacuum pump 246 in operation, an opening degree of the APC valve 244 may be adjusted based on the pressure detected by the pressure sensor 245, in order to control the inner pressure of the process chamber 201. An exhaust system (also referred to as an "exhaust part") is constituted mainly by the exhaust pipe 231, the APC valve 244 and the pressure sensor 245. The exhaust system may further include the vacuum pump 246.

A seal cap 219 serving as a furnace opening cover capable of airtightly sealing a lower end opening of the manifold 209 is provided under the manifold 209. For example, the seal cap 219 is made of a metal and is disk-shaped. An O-ring 220b serving as a sealing part is provided on an upper surface of the seal cap 219 so as to be in contact with the lower end of the manifold 209. A rotating mechanism 267 configured to rotate a boat 217 described later is provided under the seal cap 219. A rotating shaft 255 of the rotating mechanism 267 is connected to the boat 217 through the seal cap 219. As the rotating mechanism 267 rotates the boat 217, the plurality of the wafers including the wafer 200 supported by the boat 219 is rotated.

The seal cap 219 may be elevated or lowered in the vertical direction by a boat elevator 115. The boat elevator 115 serving as an elevating mechanism is provided vertically on the outside of the reaction tube 203. By elevating or lowering the seal cap 219, the boat elevator 115 serves as a transfer device (transfer mechanism) that loads the plurality of the wafers including the wafer 200 accommodated in the boat 217 into the process chamber 201 or unloads the plurality of the wafers accommodated in the boat 217 out of the process chamber 201. A shutter 221 serving as a furnace opening cover capable of airtightly sealing the lower end opening of the manifold 209 is provided under the manifold 209 or to the side of the manifold 209. The shutter 221 is configured to close the lower end opening of the manifold 209 while the seal cap 219 is lowered to unload the boat 217 out of the process chamber 201. The shutter 221 is disk-shaped as is the seal cap 219. An O-ring 220c is provided on an upper surface of the shutter 221 so as to be in contact with the lower end of the manifold 209. The opening/closing operation of the shutter 221 such as the elevation and the rotation of the shutter 221 is controlled by a shutter opening/closing mechanism 222.

The boat 217 serving as a substrate retainer aligns the plurality of the wafers including the wafer 200, for example, from 25 to 200 wafers in the vertical direction and supports the plurality of the wafers, while the plurality of the wafers is horizontally oriented with their centers aligned with each other. That is, the boat 217 supports (accommodates) the plurality of the wafers with predetermined intervals therebetween. The boat 217 is made of a heat resistant material such as quartz and silicon carbide (SiC). Insulating plates 218 are provided in multiple stages under the boat 217. The insulating plates 218 are made of a heat-resistant material such as quartz and SiC.

A temperature sensor 263 serving as a temperature detector is provided in the reaction tube 203. The state of electric conduction to the heater 207 is adjusted based on the temperature detected by the temperature sensor 263, such that an inner temperature of the process chamber 201 has a desired temperature distribution. The temperature sensor 263 is provided along the inner wall of the reaction tube 203.

Figure 3:
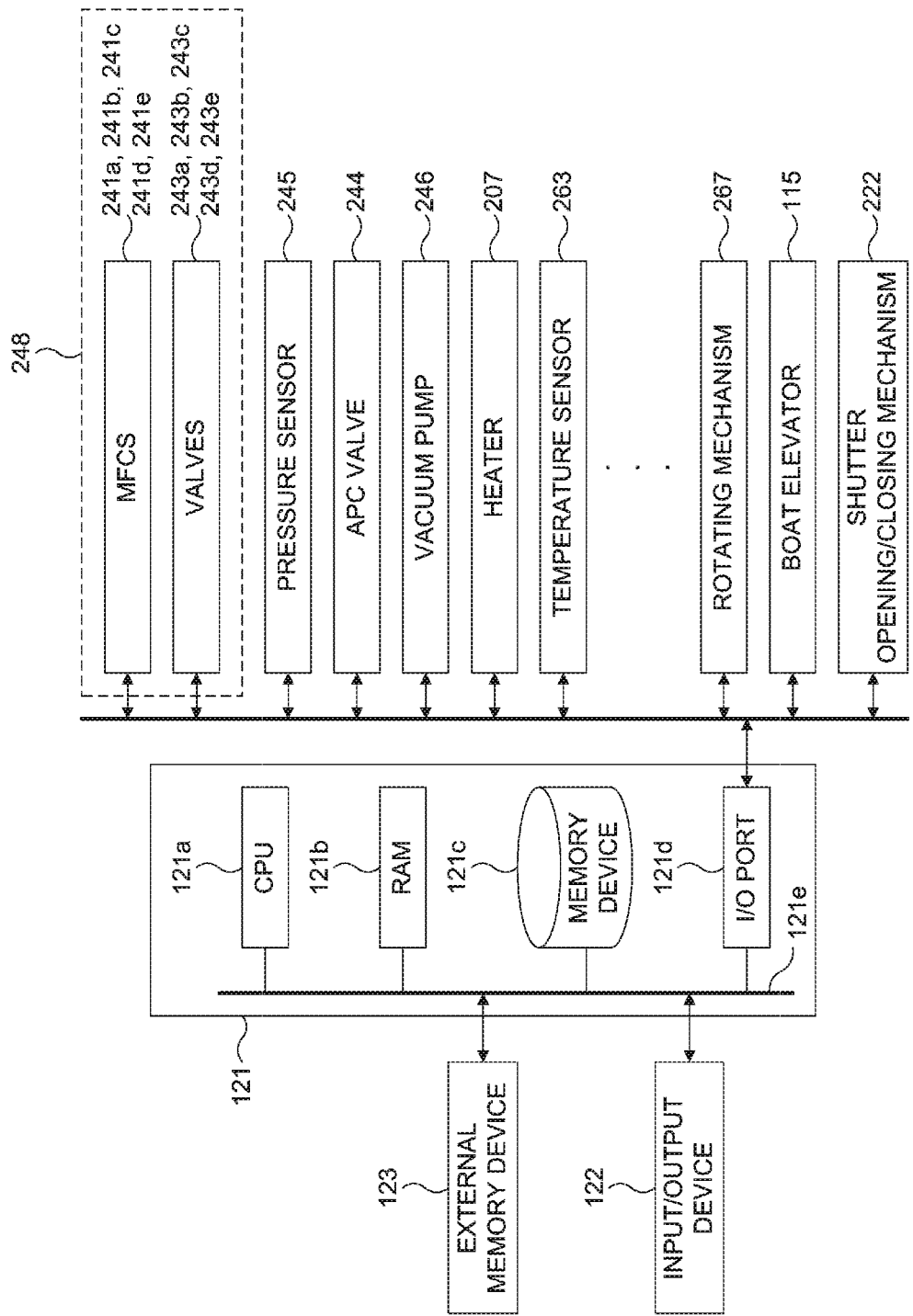
FIG. 3 is a block diagram schematically illustrating a configuration of a controller and related components of the substrate processing apparatus according to the embodiments described herein.

As shown in FIG. 3, a controller 121 serving as a control device (control mechanism) is constituted by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. For example, an input/output device 122 such as a touch panel is connected to the controller 121.

The memory device 121c is configured by components such as a flash memory and HDD (Hard Disk Drive). For example, a control program for controlling the operation of the substrate processing apparatus, a process recipe containing information on the sequences and the conditions of a substrate processing (film-forming process) described later are readably stored in the memory device 121c. The process recipe is obtained by combining steps of the substrate processing described later such that the controller 121 can execute the steps to acquire a predetermine result, and functions as a program. Hereafter, the process recipe and the control program are collectively referred to as a "program". In the present specification, the term "program" may indicate only the process recipe, indicate only the control program, or indicate both of the process recipe and the control program. The RAM 121b functions as a memory area (work area) where a program or data read by the CPU 121a is temporarily stored.

The I/O port 121d is connected to the above-described components such as the mass flow controllers (MFCs) 241a through 241e, the valves 243a through 243e, the pressure sensor 245, the APC valve 244, the vacuum pump 246, the heater 207, the temperature sensor 263, the rotating mechanism 267, the boat elevator 115 and the shutter opening/closing mechanism 222.

The CPU 121a is configured to read the control program from the memory device 121c and execute the read control program. Furthermore, the CPU 121a is configured to read a recipe such as the process recipe from the memory device 121c according to an operation command inputted from the input/output device 122. According to the contents of the read recipe, the CPU 121a may be configured to control various operations such as flow rate adjusting operations for various gases by the MFCs 241a through 241e, opening/closing operations of the valves 243a through 243e, an opening/closing operation of the APC valve 244, a pressure adjusting operation by the APC valve 244 based on the pressure sensor 245, a start and stop of the vacuum pump 246, a temperature adjusting operation of the heater 207 based on the temperature sensor 263, a rotation operation and rotation speed adjusting operation of the boat 217 by the rotating mechanism 267, an elevating and lowering operation of the boat 217 by the boat elevator 115, and an opening/closing operation of the shutter 221 by the shutter opening/closing mechanism 222.

The controller 121 may be embodied by installing the above-described program stored in an external memory device 123 into a computer. For example, the external memory device 123 may include a magnetic disk such as a hard disk, an optical disk such as a CD, a magneto-optical disk such as MO, a semiconductor memory such as a USB memory. The memory device 121c or the external memory device 123 may be embodied by a non-transitory computer readable recording medium. Hereafter, the memory device 121c and the external memory device 123 are collectively referred to as recording media. In the present specification, the term "recording media" may indicate only the memory device 121c, indicate only the external memory device 123, and indicate both of the memory device 121c and the external memory device 123. Instead of the external memory device 123, a communication means such as the Internet and a dedicated line may be used for providing the program to the computer.

(2) Film-Forming Process

Hereinafter, an exemplary sequence of the substrate processing (film-forming process) of forming a silicon nitride film (SiN film) on the wafer 200 serving as a substrate, which is a part of manufacturing processes of a semiconductor device, will be described with reference to FIG. 4. The exemplary sequence is performed by using the above-described substrate processing apparatus. Hereinafter, the operations of the components of the substrate processing apparatus are controlled by the controller 121.

Figure 4:
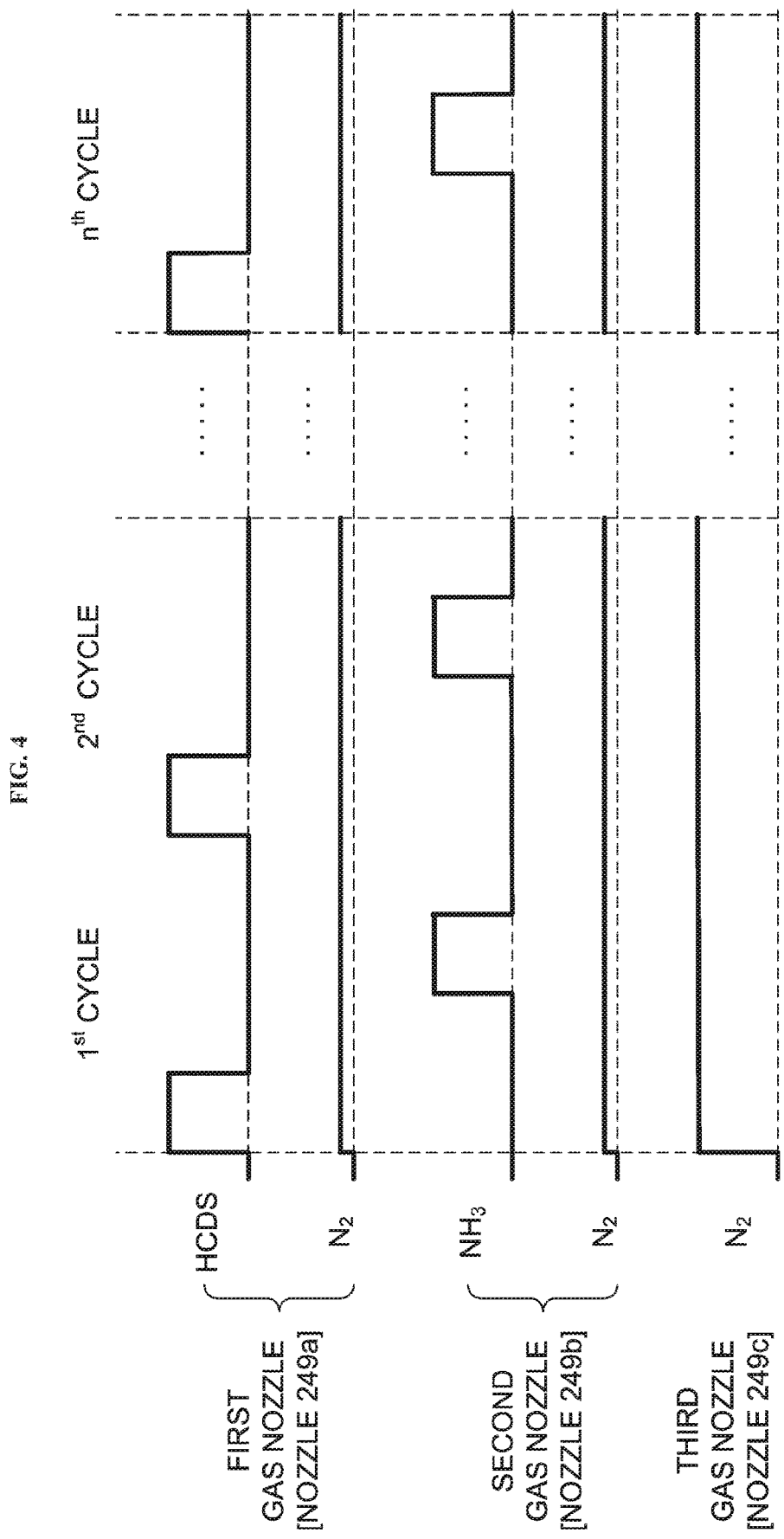
FIG. 4 schematically illustrates an exemplary film-forming sequence according to the embodiments described herein.

The exemplary sequence of the film-forming process shown in FIG. 4 includes performing a cycle a predetermined number of times (n times) to form a film containing silicon and nitrogen (that is, the SiN film) on the wafer 200. The cycle includes: (A) forming a silicon-containing layer serving as a first layer by supplying the HCDS gas to the wafer 200 through the nozzle 249a; and (B) forming a silicon nitride layer (SiN layer) serving as a second layer by supplying the NH₃ gas to the wafer 200 through the nozzle 249b, wherein (A) and (B) are non-simultaneously performed.

In the present specification, the exemplary sequence of the film-forming process shown in FIG. 4 according to the embodiments may be represented as follows:

(HCDS→NH₃)×n⇒SiN

(HCDS→NH₃)×n=>SiN

In the present specification, the term "wafer" may refer to "a wafer itself" or refer to "a wafer and a stacked structure (aggregated structure) of predetermined layers or films formed on a surface of the wafer". In addition, the term "surface of a wafer" may refer to "a surface of a wafer itself" or refer to "a surface of a predetermined layer or film formed on a wafer". In the present specification, the term "substrate" should be construed to include the meaning of "wafer".

Wafer Charging and Boat Loading Step

The plurality of the wafers including the wafer 200 is charged (transferred) into the boat 217 (wafer charging step). After the boat 217 is charged with the plurality of the wafers, the shutter 221 is moved by the shutter opening/closing mechanism 222 to open the lower end opening of the manifold 209 (shutter opening step). Then, as shown in FIG. 1, the boat 217 charged with the plurality of the wafers is elevated by the boat elevator 115 and loaded (transferred) into the process chamber 201 (boat loading step). With the boat 217 loaded, the seal cap 219 seals the lower end opening of the manifold 209 via the O-ring 220b.

Pressure and Temperature Adjusting Step

The vacuum pump 246 vacuum-exhausts the inner atmosphere of the process chamber 201 until the inner pressure of the process chamber 201 in which the plurality of the wafers including the wafer 200 is accommodated reaches a desired pressure (vacuum degree). In the pressure and temperature adjusting step, the inner pressure of the process chamber 201 is measured by the pressure sensor 245, and the APC valve 244 is feedback-controlled based on the measured pressure. The heater 207 heats the process chamber 201 until the temperature of the wafer 200 in the process chamber 201 reaches a desired film-forming temperature. The state of electric conduction to the heater 207 is feedback-controlled based on the temperature detected by the temperature sensor 263 such that the inner temperature of the process chamber 201 has a desired temperature distribution. The rotating mechanism 267 rotates the plurality of the wafers including the wafer 200 by rotating the boat 217. The vacuum pump 246 continuously vacuum-exhausts the inner atmosphere of the process chamber 201, the heater continuously heats the process chamber 201 and the rotating mechanism 267 continuously rotates the plurality of the wafers until at least the processing of the wafer 200 is completed.

Film-Forming Step

Thereafter, a film-forming step is performed by performing the step (A) and the step (B) described above sequentially.

Step (A)

In the step (A), the HCDS gas is supplied to the wafer 200 in the process chamber 201.

Specifically, the valve 243a is opened to supply the HCDS gas into the gas supply pipe 232a. The flow rate of the HCDS gas supplied into the gas supply pipe 232a is adjusted by the MFC 241a. The HCDS gas having the flow rate thereof adjusted is then supplied into the process chamber 201 through the nozzle 249a, and is exhausted through the exhaust port 233. That is, the HCDS gas is supplied to the wafer 200 in the process chamber 201 and then exhausted. In the step (A), simultaneously, the valve 243e may be opened to supply the inert gas such as the $N_2$ gas through the gas supply pipe 232e. After the flow rate of the $N_2$ gas is adjusted by the MFC 241e, the $N_2$ gas having the flow rate thereof adjusted is supplied into the process chamber 201 with the HCDS gas, and is exhausted through the exhaust port 233. In the step (A), the $N_2$ gas is supplied into the process chamber 201 through the nozzle 249c while the HCDS gas is supplied into the process chamber 201 through the nozzle 249a. The details thereof will be described later.

In the step (A), for example, the flow rate of the HCDS gas supplied through the nozzle 249a may be set to a predetermined flow rate ranging from 1 sccm to 2,000 sccm, preferably, 10 sccm to 1,000 sccm. For example, the flow rate of the $N_2$ gas supplied through the nozzle 249c may be set to a predetermined flow rate ranging from 25% to 400% of the flow rate of the HCDS gas. For example, the time duration (also referred to as a "supply time") of supplying the HCDS gas to the wafer 200 may be set to a predetermined time ranging from 1 second to 120 seconds, preferably, 1 second to 60 seconds. For example, the inner pressure of the process chamber 201 may be set to a predetermined pressure ranging from 1 Pa to 2,666 Pa, preferably, 67 Pa to 1,333 Pa. For example, the temperature (film-forming temperature) of the wafer 200 may be set to a predetermined temperature ranging from 250° C. to 800° C., preferably, 400° C. to 750° C., more preferably, 550° C. to 700° C.

By supplying the HCDS gas and the $N_2$ gas to the wafer 200 under the above-described conditions, for example, a silicon-containing layer containing chlorine (Cl) having a thickness of, for example, less than one atomic layer to several atomic layers (or less than one molecular layer to several molecular layers) is formed as the first layer on an outermost surface of the wafer 200. The silicon-containing layer containing chlorine may include only a silicon layer containing chlorine, only an adsorption layer of the HCDS, or both of them.

Under the conditions where the HCDS gas self-decomposes (thermally decomposes), the silicon layer containing chlorine is formed by the deposition of silicon on the wafer 200. Under the conditions where the HCDS gas does not self-decompose (thermally decompose), the adsorption layer of the HCDS is formed by the adsorption of the HCDS on the wafer 200. It is more preferable to form the silicon layer containing chlorine than to form the adsorption layer of the HCDS from the viewpoint of the deposition rate (film-forming rate). Hereafter, the silicon-containing layer containing chlorine may be simply referred to as a "silicon-containing layer", for convenience of description.

According to the embodiments, by supplying the $N_2$ gas through the nozzle 249c toward the center of the wafer 200 when the HCDS gas is supplied to the wafer 200, a thickness distribution of the film such as the silicon-containing layer formed on the surface of the wafer 200 may be changed from a central concave distribution to a flat distribution or a central convex distribution. In the present specification, the term "central concave distribution" refers to a distribution of the film in which the film is thinner at a central portion of the surface of the wafer 200 and gradually becomes thicker toward the edge (also referred to as an "outer circumferential portion") of the surface of the wafer 200, the term "flat distribution" refers to a distribution of the film in which the film is flat with only a small deviation in the thickness from the central portion to the edge of the wafer 200, and the term "central convex distribution" refers to a distribution of the film in which the film is thicker at the central portion of the surface of the wafer 200 and gradually becomes thinner toward the edge of the wafer 200. In other words, by controlling the amount of the $N_2$ gas supplied through the nozzle 249c into the process chamber 201 by the controller 121 such that a concentration of the inert gas ($N_2$ gas) at the central portion (center) of the wafer 200 is lower than an circumferential average concentration of the inert gas at the edge (outer circumferential portion) of the wafer 200, it is possible to control the amount of the HCDS supplied to the central portion (center) of the wafer 200. Thereby, it is possible to control the thickness distribution of the first layer such as the silicon-containing layer formed on the surface of the wafer 200 as described above.

In the step (A), with the HCDS gas supplied through the nozzle 249a, by opening the valves 243d and 243c to supply the $N_2$ gas into the gas supply pipes 232d, 232b and 232c, the $N_2$ gas is supplied into the process chamber 201 through the nozzles 249b and 249c. It is not required to maintain the supply of a small amount of the $N_2$ gas through the nozzle 249b, which is however preferable from the viewpoint of suppressing the entry of the HCDS gas into the nozzle 249b. In order to suppress the entry of the HCDS gas into the nozzle 249b, it is preferable that the supply of the $N_2$ gas through the nozzle 249b is started simultaneously with the step (A) or before the step (A).

In the step (A), each flow rate (first flow rate) of the $N_2$ gas supplied through the nozzles 249a and 249b is smaller than that of the $N_2$ gas supplied through the nozzle 249c. Preferably, each flow rate of the $N_2$ gas supplied through the nozzles 249b and 249c is set such that the total flow rate of the $N_2$ gas is smaller than the flow rate of the HCDS gas supplied through the nozzle 249a.

After the first layer having a desired thickness and a desired thickness distribution is formed, the valve 243a is closed to stop the supply of the HCDS gas. In addition, the MFCs 241d and 241c are controlled to reduce the flow rate of the $N_2$ gas supplied through the nozzles 249b and 249c, respectively. With the APC valve 244 open, the vacuum pump 246 vacuum-exhausts the inner atmosphere of the process chamber 201 to remove the residual HCDS gas in the process chamber 201 which did not react or which contributed to the formation of the first layer from the process chamber 201. The $N_2$ gas supplied through the nozzles 249a through 249c serves as the purge gas, whereby the inner atmosphere of the process chamber 201 is purged (purging step).

Step (B)

After the step (A) is completed, the $NH_3$ gas is supplied to the wafer 200 in process chamber 201, that is, to the first layer formed on the wafer 200.

In the step (B), the opening and closing of valves 243b, 243c, 243d and 243e are controlled in the same manners as those of the valves 243a, 243c, 243d and 243e in the step (A). The flow rate of the $NH_3$ gas supplied into the gas supply pipe 232b is adjusted by the MFC 241b. The $NH_3$ gas having the flow rate thereof adjusted is then supplied into the process chamber 201 through the nozzle 249b, and is exhausted through the exhaust port 233. That is, the $NH_3$ gas is supplied to the wafer 200 in the process chamber 201 and then exhausted.

In the step (B), for example, the flow rate of the $NH_3$ gas supplied through the nozzle 249b may be set to a predetermined flow rate ranging from 1,000 sccm to 10,000 sccm. For example, the time duration (also referred to as a "supply time") of supplying the $NH_3$ gas to the wafer 200 may be set to a predetermined time ranging from 1 second to 120 seconds, preferably, 1 second to 60 seconds. In the step (B), the $N_2$ gas is supplied into the process chamber 201 through the nozzle 249c while the $NH_3$ gas is supplied into the process chamber 201 through the nozzle 249b. For example, the flow rate of the $N_2$ gas supplied through the nozzle 249c may be set to a predetermined flow rate ranging from 1 sccm to 4,000 sccm. For example, the inner pressure of the process chamber 201 may be set to a predetermined pressure ranging from 1 Pa to 4,000 Pa, preferably, 1 Pa to 3,000 Pa. By setting the inner pressure of the process chamber 201 to be higher than that of the process chamber 201 in the step (A), it is possible to form the second layer described later by a chemical reaction of the $NH_3$ gas with the first layer at a predetermined rate even when the thermally activated $NH_3$ gas is used instead of the plasma activated $NH_3$ gas. The other processing conditions are the same as the processing conditions of the step (A), for example. The importance of the $N_2$ gas supplied through the nozzle 249c is lower in the step (B) than in the step (A). In the step (B), it may be not necessary to supply the $N_2$ gas through the nozzle 249c.

By supplying the $NH_3$ gas and the $N_2$ gas to the wafer 200 under the above-described conditions, at least a part of the first layer (silicon-containing layer) formed on the wafer 200 is nitrided (modified). Thereby, the second layer containing silicon and nitrogen (N), that is, the SiN layer described above is formed on the wafer 200. When the second layer is formed, impurities such as chlorine contained in the first layer may form a gas phase substance containing at least chlorine during a modifying reaction of the first layer by the $NH_3$ gas, and the gas phase substance is discharged from the process chamber 201 through the exhaust port 233. That is, the impurities such as chlorine in the first layer are separated from the first layer while being extracted and desorbed from the first layer. Then, the second layer becomes a layer which contains a smaller amount of the impurities such as chlorine than the first layer.

After the second layer is formed, the valve 243b is closed to stop the supply of the $NH_3$ gas into the process chamber 201. Then, the inner atmosphere of the process chamber 201 is vacuum-exhausted to remove the residual $NH_3$ gas in the process chamber 201 which did not react or which contributed to the formation of the second layer or the reaction by-products from the process chamber 201 in the same manners as the purging step of the step (A).

Performing a Predetermined Number of Times

By performing a cycle wherein the step (A) and the step (B) are performed non-simultaneously in this order a predetermined number (n) of times (at least once), the SiN film having a predetermined composition and a predetermined thickness is formed on the wafer 200. It is preferable that the cycle is performed a plurality of times. That is, the cycle is performed (repeated) until a total thickness of the SiN film formed by stacking the second layer by performing the cycle a plurality of times reaches the desired thickness under the condition that the second layer formed in each cycle is thinner than the desired thickness.

According to the embodiments, the HCDS gas is used as the source gas. However, instead of the HCDS gas, a chlorosilane source gas such as monochlorosilane ($SiH_3Cl$, abbreviated as MCS) gas, trichlorosilane ($SiHCl_3$, abbreviated as TCS) gas, tetrachlorosilane ($SiCl_4$, abbreviated as STC) gas, dichlorosilane ($SiH_2Cl_2$, abbreviated as DCS) gas and octachlorotrisilane ($Si_3Cl_8$, abbreviated as OCTS) may be used as the source gas.

According to the embodiments, the $NH_3$ gas is used as the reactant. However, instead of the $NH_3$ gas, for example, a hydrogen nitride-based gas such as diazene ($N_2H_2$) gas, hydrazine ($N_2H_4$) gas and $N_3H_8$ gas may be used as the reactant.

According to the embodiments, the $N_2$ gas is used as the inert gas. However, instead of the $N_2$ gas, for example, rare gases such as argon (Ar) gas, helium (He) gas, neon (Ne) gas and xenon (Xe) gas may be used as the inert gas.

Purging and Returning to Atmospheric Pressure Step

After the SiN film having the predetermined composition and the predetermined thickness is formed on the wafer 200, the $N_2$ gas serving as the purge gas is supplied into the process chamber 201 through each of the nozzles 249a, 249b and 249c, and then the $N_2$ gas supplied into the process chamber 201 is exhausted through the exhaust port 233. The inner atmosphere of the process chamber 201 is purged with the $N_2$ gas, thus the gas remaining in the process chamber 201 or the reaction by-products remaining in the process chamber 201 are removed from the process chamber 201 (purging step). Thereafter, the inner atmosphere of the process chamber 201 is replaced with the inert gas (substitution by inert gas), and the inner pressure of the process chamber 201 is returned to atmospheric pressure (returning to atmospheric pressure step).

Boat Unloading and Wafer Discharging Step

Thereafter, the seal cap 209 is lowered by the boat elevator 115 and the lower end opening of the manifold 209 is opened. The boat 217 with the plurality of processed wafers including the wafer 200 charged therein is unloaded out of the reaction tube 203 through the lower end opening of the manifold 209 (boat unloading step). After the boat 217 is unloaded, the shutter 221 is moved by the shutter opening/closing mechanism 222. The lower end opening of the manifold 209 is sealed by the shutter 221 through the O-ring 220c (shutter closing step). Then, the plurality of the processed wafers including the wafer 200 is discharged from the boat 217 (wafer discharging step).

(3) Modified Examples

For example, it is possible to various change (modify) the location of the inert gas nozzle and the shape of the reaction tube according to the embodiments as in the modified examples shown in FIGS. 5 through 7 below.

First Modified Example

Figure 5:
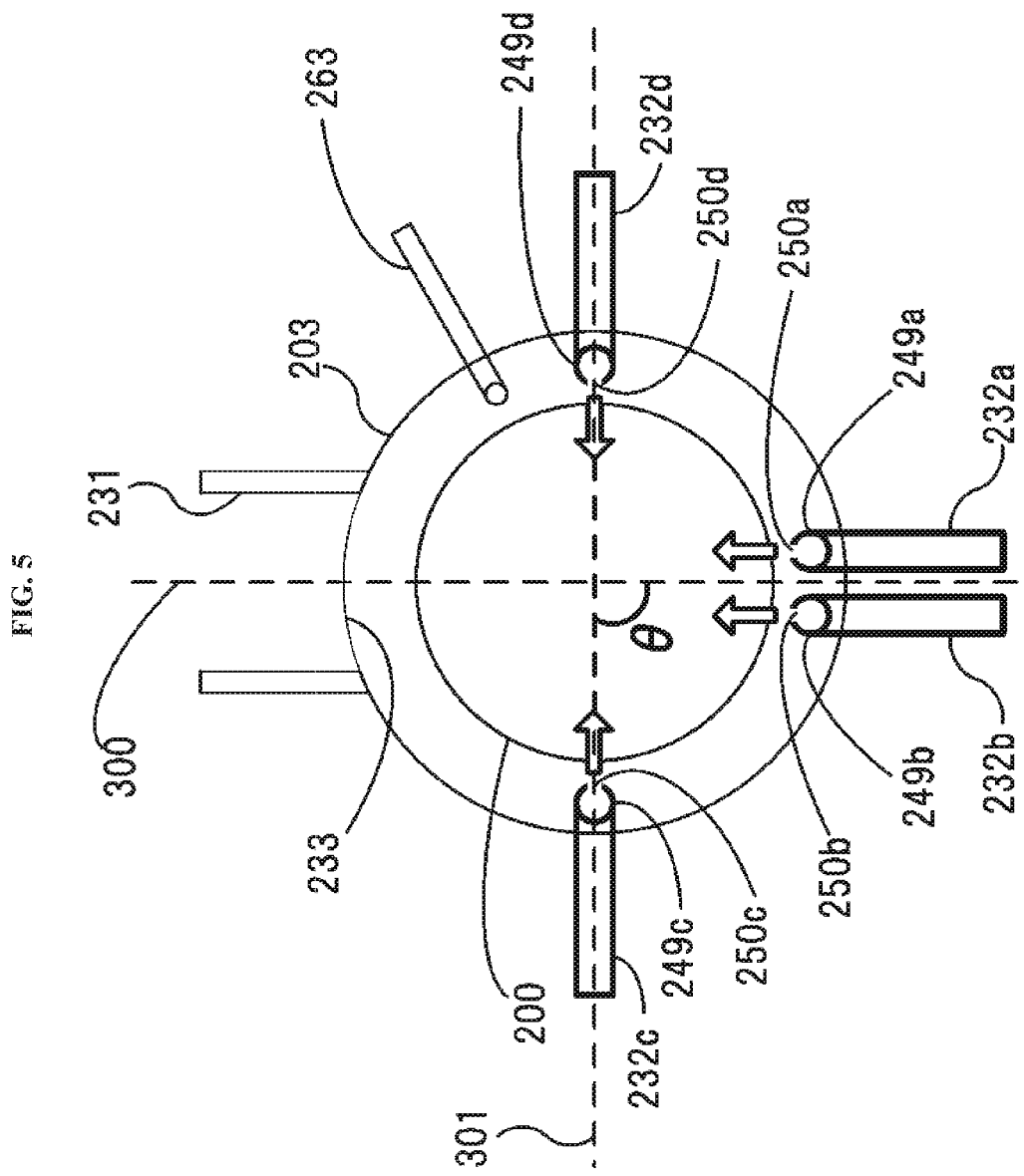
FIG. 5 schematically illustrates a first modified example of the embodiments described herein.

FIG. 5 schematically illustrates a first modified example in which a nozzle (also referred to as a "fourth gas nozzle"

or the "second inert gas nozzle") 249d serving as an inert gas nozzle configured to supply only the inert gas are additionally provided. The fourth gas nozzle 249d configured to supply the inert gas into the process chamber 201 is disposed at a region whose boundary is the first straight line (also referred to as a "boundary line") 300 connecting the center of the process gas nozzle described above (that is, for example, the midpoint between the center of the first gas nozzle 249a and the center of the second gas nozzle 249b) and the center of the wafer 200 (that is, the center of the exhaust port 233) and which is opposite to a region where the third gas nozzle 249c is disposed. The third gas nozzle (also referred to as the "first inert gas nozzle") 249c and the fourth gas nozzle (second inert gas nozzle) 249d may be disposed symmetrically with respect to the boundary line 300.

Second Modified Example

As another modified example (second modified example), a reaction tube 203 as shown in FIG. 6 may be used. The reaction tube 203 of the second modified example includes a first projecting portion 302 protruding outward so as to accommodate the process gas nozzle (the first gas nozzle 249a and the second gas nozzle 249b) and a second projecting portion 303 protruding outward so as to accommodate the third gas nozzle 249c. The first projecting portion 302 may be divided into a plurality of portions (for example, two portions) so as to accommodate the first gas nozzle 249a and the second gas nozzle 249b, respectively. In addition, an exhaust buffer 234 protruding outward is provided at a location facing the process gas nozzle, and a part of the exhaust buffer 234 facing the plurality of the wafers including the wafer 200 is largely opened to form the exhaust port 233. According to the reaction tube 203 of the second modified example, it is possible to provide a narrower space between the inner wall of the reaction tube 203 and the plurality of the wafers as compared with the embodiments. Therefore, it is possible to suppress the flow of the process gas that bypasses the periphery of the wafer 200, and to uniformize a partial pressure of the process gas on the wafer 200. However, it may be difficult to correct the tendency that the amount of the process gas supplied to the central portion (center) of the wafer 200 is insufficient. However, according to the second modified example, the inert gas supplied through the third gas nozzle 249c becomes hard to flow at the periphery of the wafer 200 and obstruct the flow of the process gas more efficiently. As a result, the process gas accumulates sectorally and can be supplied more to the central portion of the wafer 200 with a convex distribution.

A plasma electrode (not shown) may be provided in the first projecting portion 302 in parallel to the process gas nozzle (the first gas nozzle 249a and the second gas nozzle 249b) in order to excite the gas in the process gas nozzle or in the first projecting portion 302. As a result, it is possible to provide a highly active reactant. As the reactant, for example, an amine-based gas such as triethylamine ($(C_2H_5)_3N$, abbreviated as TEA) gas, an oxygen ($O_2$) gas, a water vapor ($H_2O$) gas, an ozone ($O_3$) gas, a plasma excited $O_2$ gas ($O_2^*$), an oxygen (O)-containing gas (oxidizing agent) such as a mixed gas of the $O_2$ gas and a hydrogen ($H_2$) gas, a carbon (C)-containing gas such as propylene ($C_3H_6$) gas, and a boron (B)-containing gas such as trichloroborane ($BCl_3$) gas may be used.

Third Modified Example

As still another modified example (third modified example), a reaction tube 203 as shown in FIG. 7 may be used. The reaction tube 203 of the third modified example is provided with an inner wall 304 (also referred to as an "inner tube" or a "liner") 304 inside thereof. The inner wall 304 includes the exhaust port 233 serving as a partial opening at a portion facing the first gas nozzle 249a and the second gas nozzle 249b. A first inner wall projecting portion 305 partially protruding outward so as to avoid the first gas nozzle 249a and the second gas nozzle 249b and a second inner wall projecting portion 306 partially protruding outward so as to avoid the interference between the inner wall 304 and the third gas nozzle 249c are provided at the inner wall 304. The first inner wall projecting portion 305 may be divided into a plurality of portions (for example, two portions) so as to accommodate the first gas nozzle 249a and the second gas nozzle 249b, respectively. By using the reaction tube 203 according to the third modified example, it is possible to improve the exhaustability (gas exchangeability) of the entirety of the reaction tube 203 while providing the same effects as those of the second modified example.

(4) Simulation Results

Figure 8:
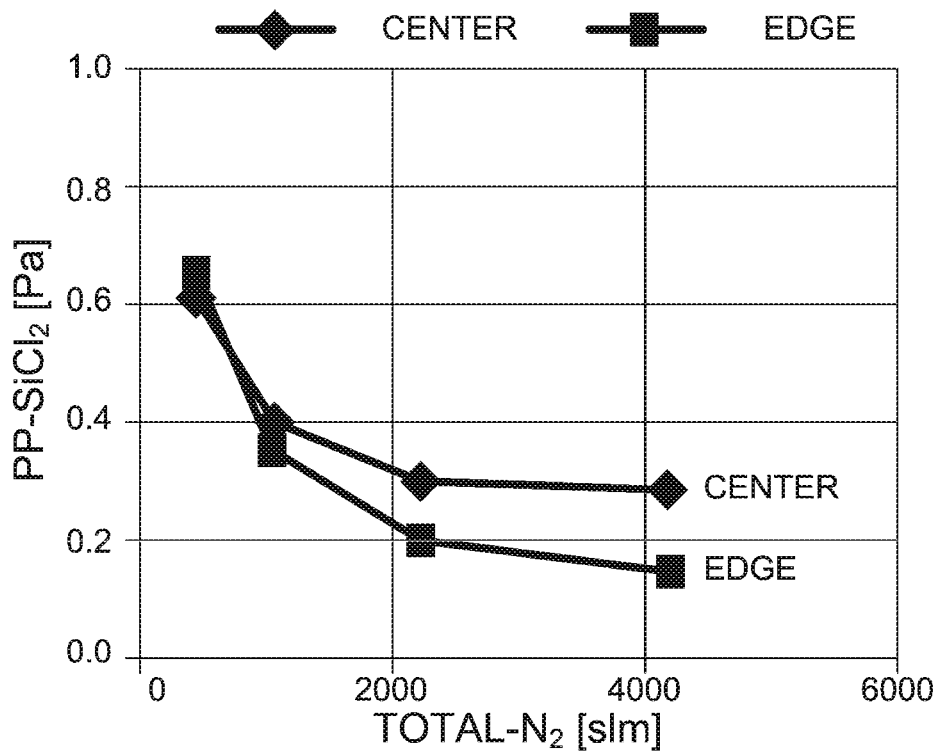
FIG. 8 schematically illustrates an analysis result of a patterned wafer model when an angle θ is set to 40° according to the first modified example of the embodiments.

FIG. 8 schematically illustrates a simulation result of a relationship between a total flow rate of the inert gas and a partial pressure of a reaction intermediate gas. In the simulation result shown in FIG. 8, it is assumed that a patterned wafer model is used, two inert gas nozzles (that is, the third gas nozzle 249c and the fourth gas nozzle 249d) are disposed symmetrically with the angle θ of 40°, and a flow rate of 400 sccm of the HCDS gas is supplied through the process gas nozzle. The vertical axis (indicated by "PP-$SiCl_2$") of the graph shown in FIG. 8 represents a partial pressure of $SiCl_2^*$ (silylene), which is an example of the reaction intermediate gas (also referred to as a "precursor" or a "radical") generated by the decomposition of the HCDS gas. The partial pressure of $SiCl_2^*$ may also represent the amount of the decomposition of the HCDS gas. That is, the simulation result shown in FIG. 8 is obtained by performing a simulation in consideration of the consumption of the HCDS gas in a patterned wafer. According to the graph shown in FIG. 8, as the total flow rate of the $N_2$ gas supplied through the two inert gas nozzles increases, the ratio of the partial pressure of the reaction intermediate gas at the center of the wafer to the partial pressure of the reaction intermediate gas at the edge of the wafer becomes larger (that is, the partial pressure of the reaction intermediate gas follows a convex distribution). However, in fact, the convex distribution of the thickness of the film is not bolstered much. In addition, the partial pressure of the reaction intermediate gas is decreased in the entirety of the wafer due to the dilution of the source gas, which means that the efficiency of using the gas is decreased and the deposition rate is also decreased.

Figure 9:
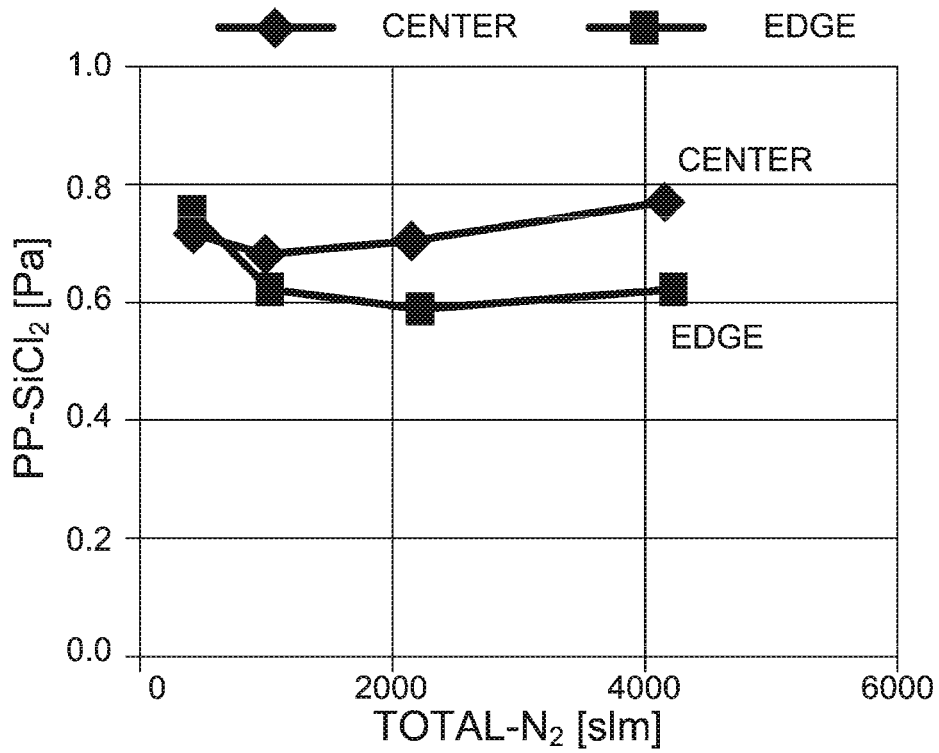
FIG. 9 schematically illustrates an analysis result of the patterned wafer model when the angle θ is set to 120° according to the first modified example of the embodiments.

FIG. 9 schematically illustrates a simulation result obtained by performing a simulation under the same conditions as FIG. 8 except that the angle θ is set to 120°. Compared to the simulation result shown in FIG. 8, the decrease in the partial pressure of the reaction intermediate gas with the increase in the total flow rate of the inert gas is clearly improved. Hereinafter, the gas which contributes to the film formation is collectively referred to as a "reactive gas", without distinguishing the reaction intermediate gas or the process gas.

Figure 10A:
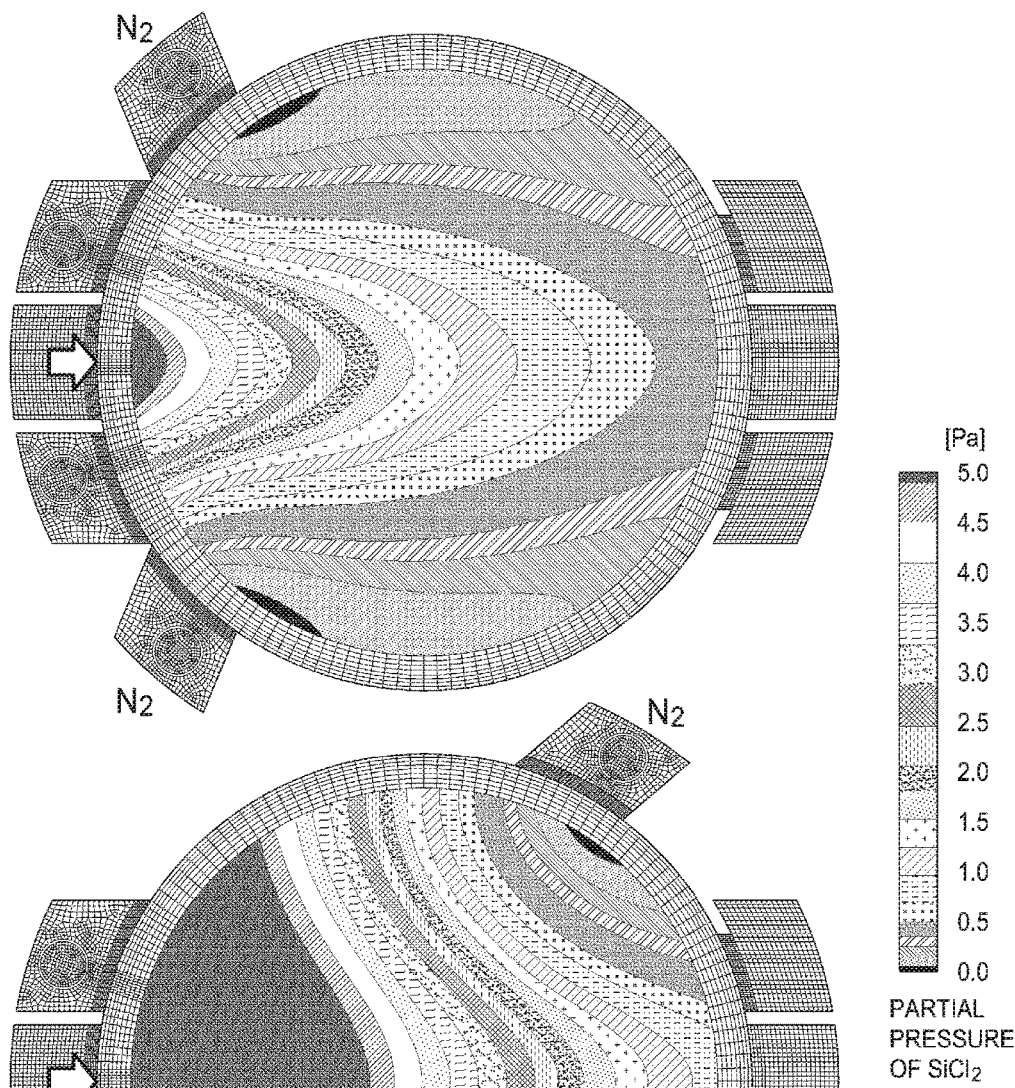
FIG. 10A schematically illustrates a distribution of a process gas when the angle θ is set to 40° according to the first modified example of the embodiments, and FIG. 10B schematically illustrates a distribution of the process gas when the angle θ is set to 120° according to the first modified example of the embodiments.
Figure 10B:
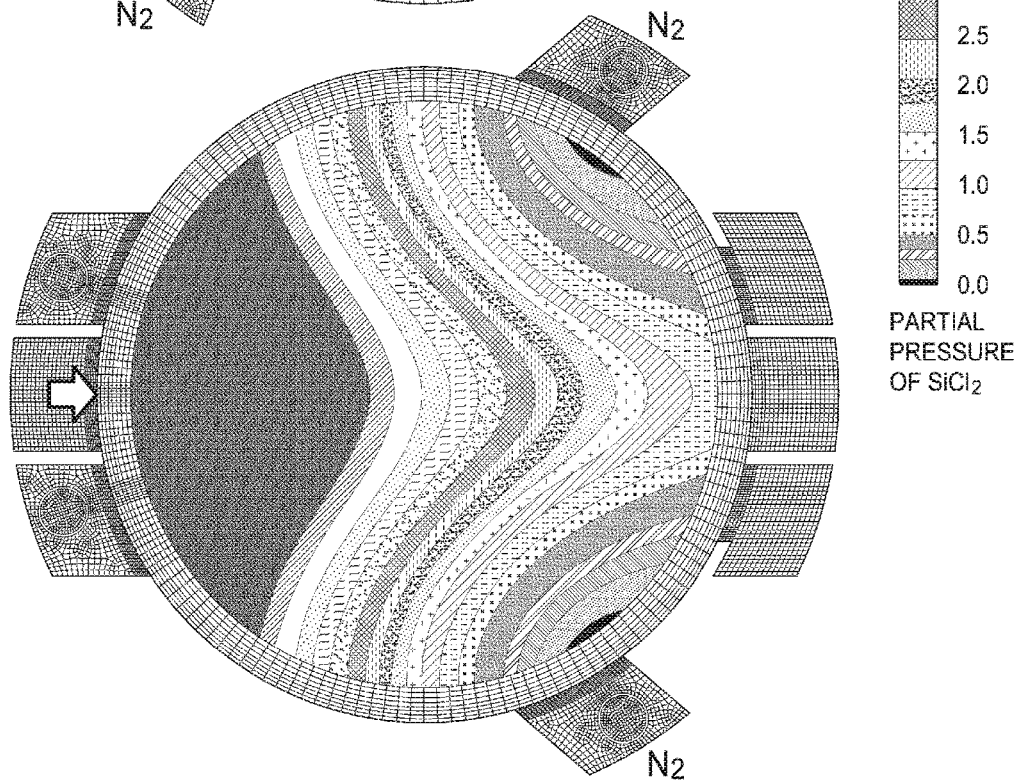

FIGS. 10A and 10B schematically illustrate a concentration distribution of the reactive gas (process gas) under the conditions used in FIGS. 8 and 9, respectively. The total flow rate of the $N_2$ gas is 2,000 sccm in both of FIGS. 10A and 10B. As shown in FIG. 10A, when the inert gas nozzles with the angle θ of 40° are used, the concentration of the reactive gas is gradually decreased as a distance from the inert gas nozzles is increased, which suggests the mixing of the reactive gas with the $N_2$ gas or the diffusion of the reactive gas. However, as shown in FIG. 10B, when the inert gas nozzles with the angle θ of 120° are used, the source gas of relatively high partial pressure of about 1 Pa is distributed within a fan shape including near the center of the wafer, and a concentration gradient at a margin of the fan shape region is relatively steep, which suggests that the mixing or the diffusion may be suppressed. The partial pressure of 1 Pa is enough to form a required film.

A film-forming distribution on the surface of the wafer may become a concave distribution due to not only the insufficiency of the gas but also the inhibition on the surface of the wafer. In order to prevent the concave distribution, it is preferable that the reactive gas is distributed with at least a predetermined partial pressure at the center of the wafer. For example, when the process gas is an excited species (such as a radical), it is generally preferable that the process gas is generally reached at the center of the wafer without being mixed with other low energy gas (for example, the inert gas with a high flow rate and relatively low temperature). In addition, in order to improve the deposition rate, it is generally preferable that the overall amount of the process gas is large. In consideration of the conditions described above, it is preferable that the inert gas nozzles of the modified examples include the two nozzles aligned in line symmetry and the angle θ is large as shown in FIG. 9. In the specification, the two nozzles with the obtuse angle θ as described above are also referred to as "side counter nozzles". By using the side counter nozzle forming a counter flow of the inert gas toward the process gas flow, it is possible to make the thickness distribution of the film formed on the surface of the wafer 200 follow the central convex distribution more reliably.

Figure 11A:
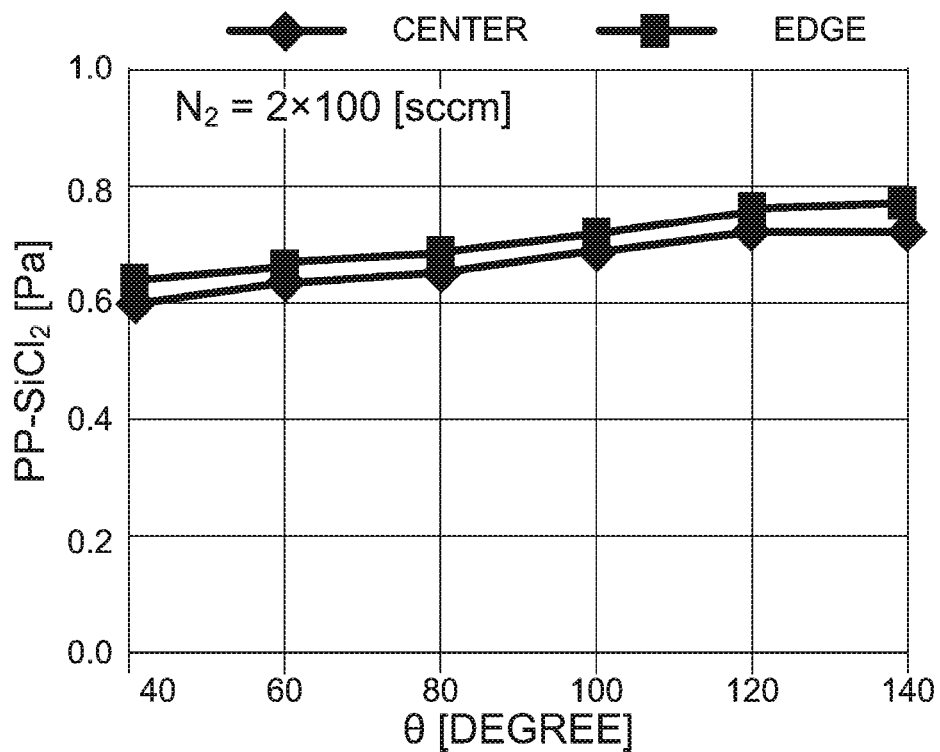
FIGS. 11A and 11B schematically illustrate a θ dependency of a partial pressure of the process gas on the wafer in the first modified example of the embodiments.
Figure 11B:
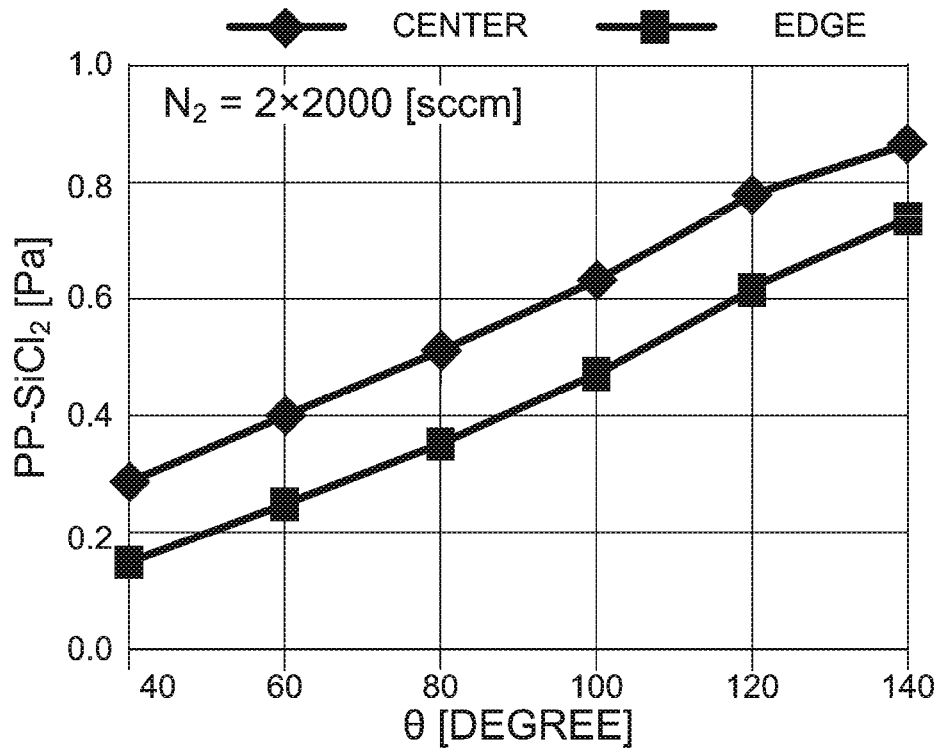

FIGS. 11A and 11B schematically illustrate a θ dependency of the partial pressure of the reactive gas (process gas) on the wafer in the first modified example of the embodiments. In case of FIGS. 11A and 11B, it is assumed that the patterned wafer model is used, the two inert gas nozzles (that is, the third gas nozzle 249c and the fourth gas nozzle 249d) are disposed symmetrically, and a flow rate of 300 sccm of the HCDS gas is supplied through the process gas nozzle. The graph shown in FIG. 11A corresponds to a flow rate of 100 sccm of the $N_2$ gas supplied through the two inert gas nozzles, respectively, and the graph shown in FIG. 11B corresponds to a flow rate of 2,000 sccm of the $N_2$ gas supplied through the two inert gas nozzles, respectively. As the angle θ is increased, the partial pressure of the reaction intermediate gas is monotonously increased, and the dependency on the flow rate of the $N_2$ gas becomes stronger. Since the inert gas nozzles cannot be provided at the same location as the exhaust port (also referred to as an "exhaust duct") 233, that the angle θ has an upper limit. For example, the upper limit of the angle θ is 140°. Focusing on the partial pressure of the reactive gas at the center of the wafer, it is to be noted that the partial pressure in the graph shown in FIG. 11A becomes lower than the partial pressure in the graph shown in FIG. 11B when the angle θ is around 110° or more. In the present specification, the angle θ in which the partial pressure in the graph shown in FIG. 11A becomes lower that the partial pressure in the graph shown in FIG. 11B is also referred to as a "reversal point". The reversal point actually depends on the flow rate of the $N_2$ gas, and may range from approximately 95° to 130°. That is, when the two inert gas nozzles are disposed at the location with the angle θ is greater than 95°, it is possible to achieve the convex distribution without being disadvantaged by the dilution of the reactive gas.

Figure 12:
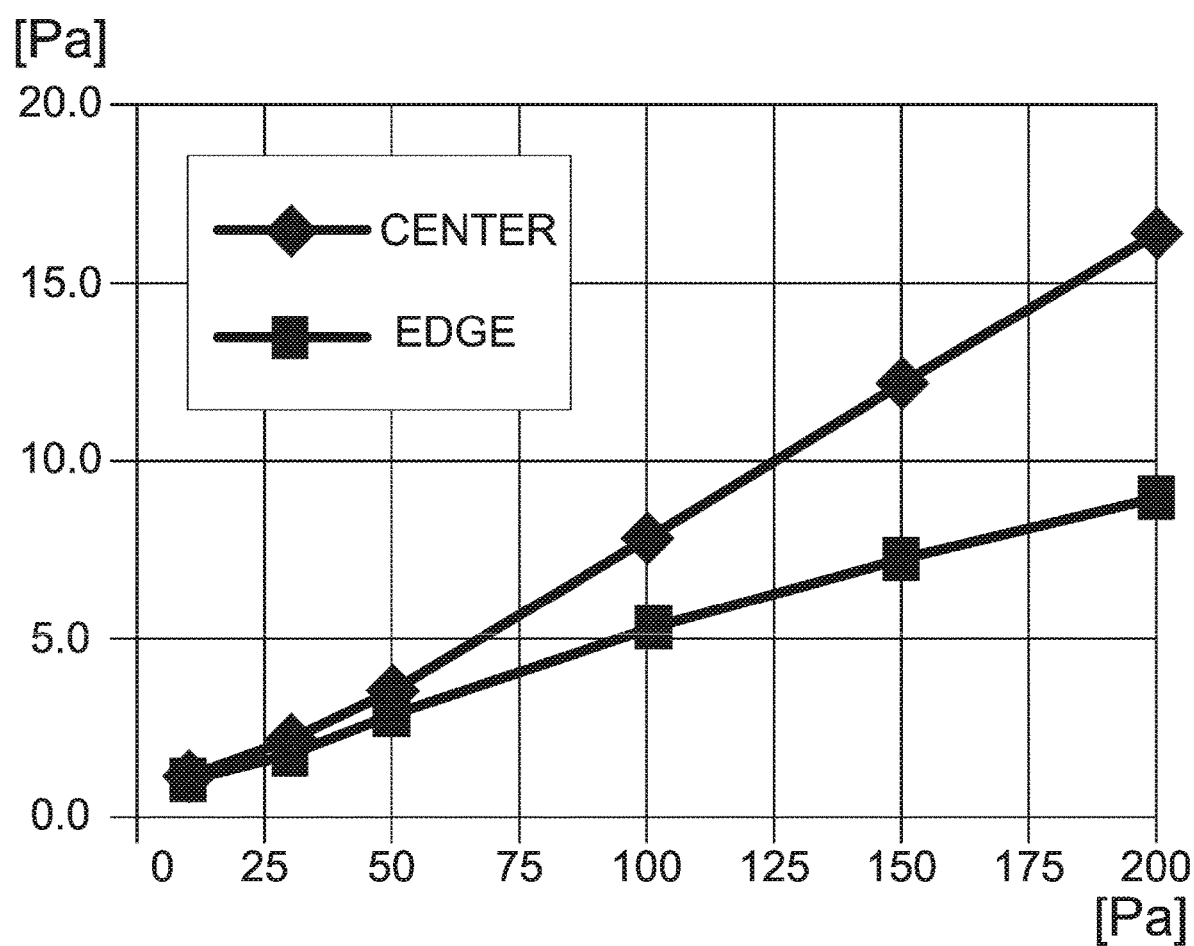
FIG. 12 is schematically illustrates an exhaust pressure dependency of the partial pressure of the process gas when one inert gas nozzle is provided according to the second modified example of the embodiments.

FIG. 12 is schematically illustrates an exhaust pressure dependency of the reactive gas (process gas) according to the second modified example. In the simulation result shown in FIG. 12, it is assumed that a flow rate of 700 sccm of the $N_2$ gas is supplied through the inert gas nozzle 249c disposed at the location with the angle θ of 120°, a flow rate of 480 sccm of the process gas is supplied through the nozzle 249b, and a flow rate of 300 sccm of the $N_2$ gas is further supplied through the nozzle 249a provided adjacent to the nozzle 249b. The horizontal axis of the graph shown in FIG. 12 represents an exhaust pressure of the exhaust pipe 231, and the vertical axis of the graph shown in FIG. 12 represents the partial pressure of the reaction intermediate gas ($SiCl_2$) on the wafer. As shown by the diamond marker line in FIG. 12, the partial pressure of the reactive gas at the center of the wafer is always higher than an average of the partial pressure of the reactive gas at the entire edge of the wafer, and a ratio of the partial pressure of the reactive gas at the center of the wafer to the partial pressure of the reactive gas at the edge of the wafer becomes slightly higher as the exhaust pressure is increased. It is considered that the ratio becomes slightly higher since the gas ejected through the process gas nozzle decelerates due to the transition from a molecular flow to a viscous flow while passing through the wafer, and tends to stay in the center of the wafer.

By adjusting the flow rate balance of the inert gas, even when only one inert gas nozzle is used, it is possible to distribute a large amount of the reactive gas to the center of the wafer than the edge of the wafer. As an example, the flow rate of the inert gas supplied through the gas nozzle 249c at a location with the obtuse angle is set to be higher than the flow rate of the inert gas supplied through the gas nozzle 249a at a location with the acute angle. Preferably, the flow rate of the inert gas supplied through the gas nozzle 249c is set to be twice or more than the flow rate of the inert gas supplied through the gas nozzle 249a. In addition, it is also confirmed that the balance between the diffusion rate and the deposition rate is not easily lost even when the exhaust pressure is increased, and the partial pressure of the reactive gas at the center of the wafer is stably distributed with high pressure. It should be noted that the partial pressure of the reactive gas in the graph shown in FIG. 12 does not directly indicate the film thickness. For example, in a process of alternately supplying the reactive gas, the convex tendency may be weakened (the film thickness at the center of the wafer may be reduced) as the exhaust pressure is increased despite the same partial pressure as shown in FIG. 11.

(5) Effects According to the Embodiments

According to the embodiments, it is possible to provide one or more advantageous effects described below.

(a) By supplying the $N_2$ gas toward the center of the wafer through the inert gas nozzle (or the inert gas nozzles) disposed at a predetermined distance from the process gas nozzle in the circumferential direction of the wafer while supplying the process gas through the process gas nozzle to the wafer, it is possible to make the thickness distribution of the film formed on the surface of the wafer follow the central convex distribution. In this instance, increase of the concentration of the process gases is more than compensate for decrease due to dilution and diffusion at least at the center of the wafer.

(b) By providing the process gas nozzle and the inert gas nozzle (or the inert gas nozzles) at a predetermined distance in the circumferential direction of the wafer, it is possible to improve the controllability of the thickness distribution of the first layer on the surface of the wafer, that is, the controllability of the thickness distribution of the film formed on the surface of the wafer. That is, by appropriately adjusting the flow rate the $N_2$ gas and the angle θ, it is possible to form a film having the flat distribution on the patterned wafer. It is considered that the thickness distribution of the film formed on the surface of the wafer depends on a surface area of the wafer due to a so-called loading effect. As the surface area of the wafer where the film is to be formed is increased, a large amount of the process gas (reactive gas) is consumed at a peripheral portion of the wafer (that is, the edge of the wafer), and it is difficult for the process gas (reactive gas) to reach the center (central portion) of the wafer. As a result, the thickness distribution of the film formed on the surface of the wafer becomes the central concave distribution. However, according to the embodiments, even when the patterned wafer having a large surface area is used as the wafer, it is possible to make the thickness distribution of the film formed on the surface of the wafer follow the convex distribution. Further, it is also possible to control the thickness distribution of the film with a high degree of freedom, for example, by changing the central concave distribution to more flat distribution. In addition to the film thickness, it is also possible to control the uniformity of the composition ratio and the impurity concentration of the film formed on the surface of the wafer.

The surface area of the wafer is determined by parameters such as a pattern of the patterned wafer and a depth of a trench of the patterned wafer. That is, the optimum range of the flow rate of the $N_2$ gas or the angle θ is determined in relation to the parameters such as the pattern of the patterned wafer or the depth of the trench of the patterned wafer. For example, it is preferable that the angle θ increases as the surface area of the wafer increases (that is, as the trench becomes deeper), and that the angle θ decreases as the surface area of the wafer decreases (that is, as the trench becomes shallower). By shifting the exhaust port 233 from the location facing the process gas nozzle, it is possible to increase the angle θ up to 180°.

Other Embodiments

While the technique is described by way of the above-described embodiments and the modified examples, the above-described technique is not limited thereto. The above-described technique may be modified in various ways without departing from the gist thereof. For example, while the embodiments are described by way of an example in which the film containing silicon as the main element is formed on the wafer, the above-described technique is not limited thereto. For example, the above-described technique may be preferably applied to form on the wafer a film containing a metalloid element such as germanium (Ge) and boron (B) as a main element other than silicon. In addition, the above-described technique may be preferably applied to form on the wafer a film containing a metal element such as titanium (Ti), zirconium (Zr), hafnium (Hf), niobium (Nb), tantalum (Ta), molybdenum (Mo), tungsten (W), yttrium (Y), lanthanum (La), strontium (Sr) and aluminum (Al) as a main element.

For example, the above-described technique may be applied to form on the wafer films such as a titanium nitride film (TiN film), a titanium oxynitride film (TiON film), a titanium aluminum carbonitride film (TiAlCN film), a titanium aluminum carbide film (TiAlC film), a titanium carbonitride film (TiCN film) and a titanium oxide film (TiO film). For example, gases such as titanium tetrachloride ($TiCl_4$) gas and trimethylaluminum ($Al(CH_3)_3$, abbreviated as TMA) gas may be used when forming the films described above.

The recipe used for the substrate processing (film-forming process) may be separately prepared depending on the contents of the substrate processing, and stored in the memory device 121c through an electrical telecommunication line or the external memory device 123. When the substrate processing is started, the CPU 121a may select a proper recipe among a plurality of recipes stored in the memory device 121c, depending on the contents of the substrate processing. Thus, it is possible to form plural kinds of films having various composition ratios, qualities and thicknesses by only a single substrate processing apparatus in a universal and highly reproducible manner. Furthermore, it is possible to reduce the burden of an operator, and to start the substrate processing promptly without an operation mistake.

The above-described recipes are not limited to newly created recipes. For example, an existing recipe which is already installed in the substrate processing apparatus may be changed to a new recipe. When a recipe is to be changed, the recipe may be installed in the substrate processing apparatus through an electrical communication line or a recording medium having the recipe written therein. The input/output device 122 installed in the existing substrate processing apparatus may be operated to directly change the existing recipe which is already installed in the substrate processing apparatus to the new recipe.

The above-described embodiments and the modified examples may be appropriately combined. The processing sequences and the processing conditions of the combinations may be substantially the same as those of the above-described embodiments.

Films such as the SiN film formed in accordance with the above-described embodiments or the modified examples may be widely used, for example, as an insulating film, a spacer film, a mask film, a charge storage film and a stress control film. As the semiconductor device is miniaturized, the film formed on the surface of the wafer is required to have a more uniform thickness. According to the above-described technique, for example, a film having a flat distribution may be formed on a patterned wafer having a high-density pattern thereon. Therefore, according to the above-described technique, it is possible to form a film having a more uniform thickness on the surface of the wafer.

According to some embodiments in the present disclosure, it is possible to improve the film thickness uniformity on the surface of the wafer whereon the film is formed.

What is claimed is:

1. A substrate processing apparatus comprising:
a process chamber in which a substrate is processed;
two process gas nozzles arranged substantially in parallel with a gap therebetween, and configured to supply a process gas into the process chamber;
a first inert gas nozzle and a second inert gas nozzle fluidly coupled to an inert gas supply, the first and second inert gas nozzles provided respectively in two regions divided by a first straight line passing through the gap between the two process gas nozzles and a center of the substrate, and configured to supply an inert gas into the process chamber, wherein an angle between the first straight line and a second straight line extending from the center of the substrate to each of the first and second inert gas nozzles is within a range from 90 to 180 degrees;

an exhaust pipe configured to exhaust an inner atmosphere of the process chamber; and a controller configured to set a first flow rate of the inert gas through the first inert gas nozzle and a second flow rate of inert gas through the second inert gas nozzle not less than a flow rate of the process gas through one of the two process gas nozzles.

2. The substrate processing apparatus of claim 1, wherein the two process gas nozzles are disposed further away from the exhaust pipe than the first and second inert gas nozzles, and the gap between the two process gas nozzles and each of the first and second inert gas nozzles are aligned with the angle determined according to a surface area of the substrate.

3. The substrate processing apparatus of claim 2, wherein the angle becomes larger as the surface area of the substrate becomes larger, and the angle becomes smaller as the surface area of the substrate becomes smaller.

4. The substrate processing apparatus of claim 3, wherein at least one of the first and second inert gas nozzles is provided such that the inert gas is ejected toward the center of the substrate.

5. The substrate processing apparatus of claim 2, wherein the first and second inert gas nozzles simultaneously supply the inert gas at the first flow rate and the second flow rate large enough to make a concentration of the process gas at the center of the substrate higher than a concentration of the process gas circumferentially averaged at an edge of the substrate.

6. The substrate processing apparatus of claim 5, wherein the first and second inert gas nozzles simultaneously supply the inert gas at the first flow rate and the second flow rate large enough to make the concentration of the process gas at the center of the substrate higher than a concentration without supplying the inert gas.

7. The substrate processing apparatus of claim 6, wherein the first and second inert gas nozzles are aligned in line symmetry with respect to a boundary line.

8. A method of manufacturing a semiconductor device comprising:
(a) providing the substrate processing apparatus of claim 1;
(b) loading a substrate into the process chamber in which the substrate is processed; and
(c) processing the substrate by supplying a process gas into the process chamber through the process gas nozzle,
wherein an inert gas is supplied into the process chamber through the first and second inert gas nozzles.

9. The substrate processing apparatus of claim 1, further comprising:
a reaction tube configuring the process chamber and comprising a first projecting portion protruding outward so as to accommodate the two process gas nozzles and a second projecting portion protruding outward so as to accommodate at least one of the first and second inert gas nozzles.

10. The substrate processing apparatus of claim 1, further comprising:
an inner wall provided in the process chamber to enclose a part of the process chamber, in which the substrate is processed;

wherein the inner wall comprises:
an opening formed at a portion opposing the two process gas nozzles;
a first projecting portion accommodating the two process gas nozzles inside the inner wall; and
a second projecting portion accommodating at least one of the first and second inert gas nozzles inside the inner wall,
wherein each of the first projecting portion and the second projecting portion protrudes outward from a part of the inner wall so as to prevent the two process gas nozzles and at least one of the first and second inert gas nozzles from interfering with the inner wall.

11. A substrate processing apparatus comprising:
a process chamber in which a substrate is processed;
two process gas nozzles arranged substantially in parallel with a gap therebetween, and configured to supply a process gas into the process chamber;
a first inert gas nozzle and a second inert gas nozzle fluidly coupled to an inert gas supply, the first and second inert gas nozzles provided respectively in two regions divided by a first straight line passing through the gap between the two process gas nozzles and a center of the substrate, and configured to supply inert gas into the process chamber, wherein an angle between the first straight line and a second straight line extending from the center of the substrate to each of the first and second inert gas nozzles is within a range from 90 to 180 degrees;
an exhaust port configured to exhaust an inner atmosphere of the process chamber; and
a controller configured to control a first flow rate of inert gas through the first inert gas nozzle and a second flow rate of inert gas through the second inert gas nozzle so that a concentration of the process gas at the center of the substrate is higher than a concentration of the process gas circumferentially averaged at an edge of the substrate when the process gas from the two process gas nozzles and the inert gas from the first and second inert gas nozzles flow over the substrate.

12. The substrate processing apparatus of claim 11, wherein the controller is configured to set the first flow rate and the second flow rate not less than a flow rate of the process gas through one of the two process gas nozzles.

13. The substrate processing apparatus of claim 11, wherein the controller comprises:
a first mass flow controller provided on a first supply pipe connected to the first inert gas nozzle and configured to set the first flow rate to a predetermined rate between 700 sccm to 4,000 sccm; and
a second mass flow controller provided on a second supply pipe connected to the second inert gas nozzle and configured to set the second flow rate to a predetermined rate between 700 sccm to 4,000 sccm.

14. The substrate processing apparatus of claim 1, wherein the first inert gas nozzle and the second inert gas nozzle are arranged so that a relatively high partial pressure of the process gas or a relatively high partial pressure of a reaction intermediate gas is distributed within a region of a fan shape including the center of the substrate.

15. The substrate processing apparatus of claim 1, wherein at least one of the two process gas nozzles is configured to supply a silicon source gas that self-decomposes in the process chamber.

16. The substrate processing apparatus of claim 1, wherein at least one of the two process gas nozzles is further configured to supply a silicon source gas that self-decomposes in the process chamber.

17. A method of manufacturing a semiconductor device using the substrate processing apparatus of claim 1, comprising:
supplying simultaneously the process gas and the inert gas into the process chamber while controlling the first flow rate and the second flow rate so that a concentration of the process gas at the center of the substrate is higher than a concentration of the process gas circumferentially averaged along an edge of the substrate when the process gas from the two process gas nozzles and the inert gas from the first and second inert gas nozzles flow over the substrate.

18. A method of processing the substrate using the substrate processing apparatus of claim 1, comprising:
supplying simultaneously the process gas and the inert gas into the process chamber while controlling the first flow rate and the second flow rate so that a concentration of the process gas at the center of the substrate is higher than a concentration of the process gas circumferentially averaged along an edge of the substrate when the process gas from the two process gas nozzles and the inert gas from the first and second inert gas nozzles flow over the substrate.

* * * * *